(12) United States Patent
Kobayashi et al.

(10) Patent No.: US 11,217,441 B2
(45) Date of Patent: Jan. 4, 2022

(54) SUBSTRATE TREATMENT METHOD AND SUBSTRATE TREATMENT APPARATUS

(71) Applicant: SCREEN Holdings Co., Ltd., Kyoto (JP)

(72) Inventors: Kenji Kobayashi, Kyoto (JP); Manabu Okutani, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/555,307

(22) Filed: Aug. 29, 2019

(65) Prior Publication Data

US 2019/0385835 A1    Dec. 19, 2019

Related U.S. Application Data

(63) Continuation of application No. 15/587,841, filed on May 5, 2017, now abandoned, which is a continuation (Continued)

(51) Int. Cl.
*H01L 21/67* (2006.01)
*H01L 21/02* (2006.01)

(Continued)

(52) U.S. Cl.
CPC ........ *H01L 21/02052* (2013.01); *B08B 3/022* (2013.01); *C23C 16/458* (2013.01); *C23C 16/46* (2013.01); *C23C 16/52* (2013.01); *H01L 21/02057* (2013.01); *H01L 21/30604* (2013.01); *H01L 21/324* (2013.01);

(Continued)

(58) Field of Classification Search
CPC . C23C 15/00; C23F 4/04; C23F 17/00; H01L 21/31055; H01L 21/67248
See application file for complete search history.

(56) References Cited

U.S. PATENT DOCUMENTS

| 5,882,433 A | 3/1999 | Ueno ............................. 134/31 |
| 2004/0055707 A1* | 3/2004 | Sato .................. H01L 21/67017 156/345.11 |

(Continued)

FOREIGN PATENT DOCUMENTS

| CN | 102099900 A | 6/2011 |
| CN | 102741984 A | 10/2012 |

(Continued)

*Primary Examiner* — Thomas T Pham
(74) *Attorney, Agent, or Firm* — Ostrolenk Faber LLP

(57) ABSTRACT

A substrate treatment method is provided, which includes: an organic solvent replacing step of supplying an organic solvent, whereby a liquid film of the organic solvent is formed on the substrate as covering the upper surface of the substrate to replace a rinse liquid with the organic solvent; a substrate temperature increasing step of allowing the temperature of the upper surface of the substrate to reach a first temperature level higher than the boiling point of the organic solvent after the formation of the organic solvent liquid film, whereby a vapor film of the organic solvent is formed below the entire organic solvent liquid film between the organic solvent liquid film and the substrate to levitate the organic solvent liquid film above the organic solvent vapor film; and an organic solvent removing step of removing the levitated organic solvent liquid film from above the upper surface of the substrate.

6 Claims, 19 Drawing Sheets

Related U.S. Application Data of application No. 14/667,769, filed on Mar. 25, 2015, now Pat. No. 9,698,031.

(51) Int. Cl.

| | |
|---|---|
| *H01L 21/687* | (2006.01) |
| *C23C 16/458* | (2006.01) |
| *C23C 16/46* | (2006.01) |
| *C23C 16/52* | (2006.01) |
| *H01L 21/306* | (2006.01) |
| *H01L 21/324* | (2006.01) |
| *H01L 21/673* | (2006.01) |
| *B08B 3/02* | (2006.01) |

(52) U.S. Cl.
CPC .... *H01L 21/6704* (2013.01); *H01L 21/67028* (2013.01); *H01L 21/67034* (2013.01); *H01L 21/67051* (2013.01); *H01L 21/67075* (2013.01); *H01L 21/67103* (2013.01); *H01L 21/67109* (2013.01); *H01L 21/67248* (2013.01); *H01L 21/67253* (2013.01); *H01L 21/67303* (2013.01); *H01L 21/68728* (2013.01); *H01L 21/68764* (2013.01); *H01L 21/68792* (2013.01)

(56) References Cited

U.S. PATENT DOCUMENTS

| | | | |
|---|---|---|---|
| 2008/0006617 A1* | 1/2008 | Harris | H01L 21/6719 219/390 |
| 2010/0055924 A1 | 3/2010 | Ganesan | 438/748 |
| 2011/0155177 A1 | 6/2011 | Tamura et al. | 134/18 |
| 2011/0189858 A1 | 8/2011 | Yasseri et al. | 438/694 |
| 2012/0118332 A1 | 5/2012 | Sato et al. | 134/30 |
| 2013/0260574 A1* | 10/2013 | Masuhara | H01L 21/67115 438/782 |
| 2014/0127908 A1 | 5/2014 | Okutani | 438/694 |
| 2014/0261566 A1 | 9/2014 | Hayashi | 134/26 |
| 2016/0025409 A1* | 1/2016 | Miyazaki | F26B 3/28 34/274 |

FOREIGN PATENT DOCUMENTS

| | | |
|---|---|---|
| CN | 103811302 A | 5/2014 |
| JP | 2012-109301 A | 6/2012 |
| JP | 2013-243413 A | 12/2013 |
| JP | 2014-183063 A | 9/2014 |

\* cited by examiner

CLAMPING STATE

UNCLAMPING STATE

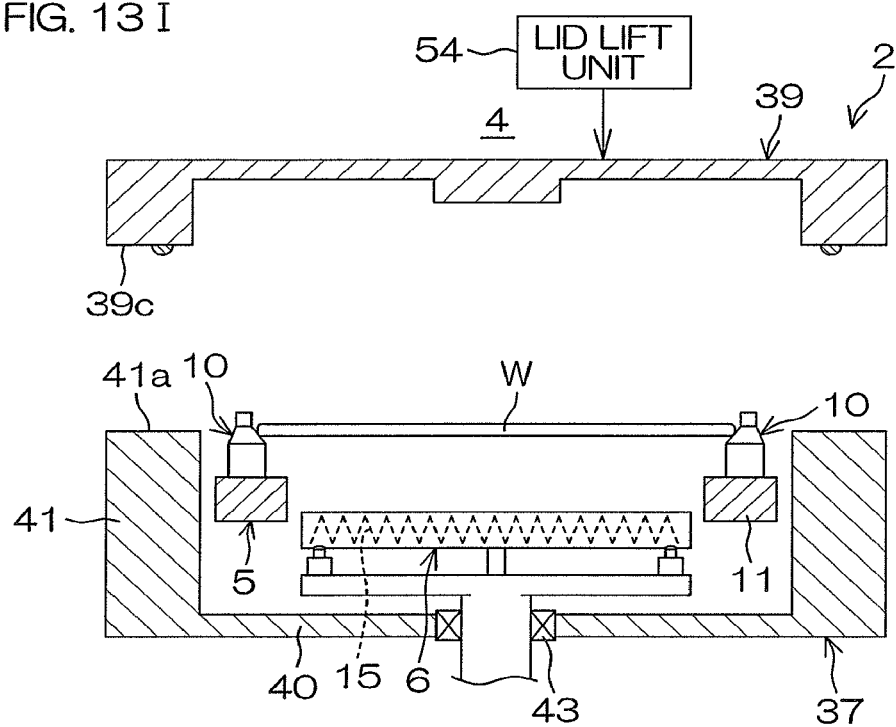

SUBSTRATE TREATMENT METHOD AND SUBSTRATE TREATMENT APPARATUS

CROSS-REFERENCE TO RELATED APPLICATIONS

This application is a continuation of U.S. patent application Ser. No. 15/587,841, filed May 5, 2017, which is a continuation of U.S. application Ser. No. 14/667,769, filed Mar. 25, 2015, now U.S. Pat. No. 9,698,031, issued Jul. 4, 2017, which claims the benefit of Japanese Patent Application No. 2014-062400, filed Mar. 25, 2014, both incorporated herein by reference.

BACKGROUND OF THE INVENTION

1. Field of the Invention

The present invention relates to a substrate treatment method and a substrate treatment apparatus for treating a substrate such as a semiconductor wafer.

2. Description of the Related Art

In semiconductor device production processes, a treatment liquid is supplied to a front surface of a substrate such as a semiconductor wafer to treat the front surface of the substrate with the treatment liquid.

A substrate treatment apparatus of a single substrate treatment type adapted to treat a single substrate at a time, for example, includes a spin chuck which generally horizontally holds the substrate and rotates the substrate, and a nozzle which supplies the treatment liquid to the front surface of the substrate rotated by the spin chuck. For example, a chemical liquid is supplied to the substrate held by the spin chuck, and then a rinse liquid is supplied to the substrate, whereby the chemical liquid is replaced with the rinse liquid on the substrate. Thereafter, a spin drying step is performed to remove the rinse liquid from the substrate. In the spin drying step, the substrate is rotated at a higher speed to spin off the rinse liquid from the substrate (to dry the substrate). In the spin drying step, it is impossible to completely remove the rinse liquid trapped in gaps of a minute pattern formed on the front surface of the substrate, resulting in insufficient drying.

To cope with this, U.S. Pat. No. 5,882,433 proposes a method such that an organic solvent such as liquid isopropyl alcohol (IPA) at an ordinary temperature is supplied to the front surface of the substrate after the rinsing step, whereby the rinse liquid trapped in the gaps of the pattern on the front surface of the substrate is replaced with the organic solvent for drying the front surface of the substrate.

SUMMARY OF THE INVENTION

In the spin drying step, adjacent pattern portions of the minute pattern are liable to attract each other to be brought into contact with each other, resulting in collapse of the pattern. This is supposedly partly because of a surface tension of a liquid present between the adjacent pattern portions. Where an organic solvent having a lower surface tension is supplied to the substrate before the spin drying step as in U.S. Pat. No. 5,882,433, attractive forces occurring between the adjacent pattern portions are reduced because the organic solvent which is present between the pattern portions has a lower surface tension. As a result, the collapse of the pattern is prevented.

In recent years, however, a minute pattern (a projection pattern, a line pattern and the like) having a higher aspect ratio is formed on a front surface of a semiconductor substrate for higher density integration. The minute pattern having a higher aspect ratio is more liable to be collapsed. Therefore, it will be impossible to sufficiently suppress the collapse of the minute pattern simply by supplying the organic solvent to the front surface of the substrate before the spin drying step.

It is therefore an object of the present invention to provide a substrate treatment method and a substrate treatment apparatus which ensure proper drying of the front surface of the substrate while suppressing or preventing the collapse of the pattern.

According to the present invention, there is provided a substrate treatment method, which includes: an organic solvent replacing step of supplying, to an upper surface of a horizontally held substrate, an organic solvent having a lower surface tension than a rinse liquid adhering to the upper surface of the substrate, whereby a liquid film of the organic solvent is formed on the substrate as covering the upper surface of the substrate to replace the rinse liquid with the organic solvent; a substrate temperature increasing step of allowing the temperature of the upper surface of the substrate to reach a predetermined first temperature level higher than the boiling point of the organic solvent after the formation of the organic solvent liquid film, whereby a vapor film of the organic solvent is formed below the entire organic solvent liquid film between the organic solvent liquid film and the upper surface of the substrate to levitate the organic solvent liquid film above the organic solvent vapor film; and an organic solvent removing step of removing the levitated organic solvent liquid film from above the upper surface of the substrate.

According to this method, the liquid organic solvent is supplied to the upper surface of the substrate to form the organic solvent liquid film covering the upper surface of the substrate on the substrate, whereby the rinse liquid adhering to the upper surface of the substrate is replaced with the liquid organic solvent. Since the organic solvent liquid film covers the entire upper surface of the substrate, the rinse liquid can be properly replaced with the liquid organic solvent on the entire upper surface of the substrate. After the formation of the organic solvent liquid film, the temperature of the upper surface of the substrate is allowed to reach the first temperature level. Thus, the organic solvent vapor film is formed on the entire upper surface of the substrate between the organic solvent liquid film and the upper surface of the substrate, and the organic solvent liquid film is levitated above the organic solvent vapor film. In this state, the magnitude of a frictional force occurring between the upper surface of the substrate and the organic solvent liquid film is generally zero, so that the organic solvent liquid film is easily moved along the upper surface of the substrate.

In the organic solvent removing step, a force for moving the organic solvent liquid film laterally of the substrate acts on the organic solvent liquid film. Thus, the organic solvent liquid film is moved along the upper surface of the substrate to be expelled from a peripheral portion of the substrate. The organic solvent liquid film is moved in the form of liquid mass (i.e., without disintegration into a multiplicity of liquid droplets), whereby the organic solvent liquid film can be smoothly completely removed from above the substrate.

Therefore, the organic solvent does not remain in the form of liquid droplets on the upper surface of the substrate after the removal of the organic solvent liquid film. That is, even if a minute pattern is provided on the upper surface of the substrate, the liquid organic solvent does not remain in gaps of the minute pattern. Therefore, even where the substrate having the minute pattern on the upper surface thereof is treated, it is possible to properly dry the upper surface of the substrate while suppressing or preventing the collapse of the pattern.

According to one embodiment of the present invention, the substrate treatment method further includes a puddling step of stopping rotation of the substrate or rotating the substrate at a puddling speed in the organic solvent replacing step.

According to this method, the puddling step is performed in the organic solvent replacing step. In the puddling step, the rotation of the substrate is stopped, or the substrate is rotated at the puddling speed. As the rotation speed of the substrate is reduced, a centrifugal force acting on the liquid organic solvent present on the substrate becomes zero or is reduced. Therefore, the liquid organic solvent is not expelled from the peripheral portion of the substrate, but remains on the upper surface of the substrate. As a result, the organic solvent liquid film is retained in a puddle-like form on the upper surface of the substrate. The rinse liquid present on the upper surface of the substrate is replaced with the organic solvent contained in the organic solvent liquid film retained on the upper surface of the substrate. Therefore, the rinse liquid can be more advantageously replaced with the organic solvent on the upper surface of the substrate.

The substrate treatment method may further include a first higher speed rotation step of rotating the substrate at a first rotation speed prior to the puddling step in the organic solvent replacing step, the first rotation speed being higher than a rotation speed of the substrate observed in the puddling step.

According to this method, the first higher speed rotation step is performed prior to the puddling step. In the first higher speed rotation step, the substrate is rotated at the first rotation speed, whereby the liquid organic solvent present on the substrate receives a centrifugal force generated by the rotation of the substrate to spread toward the peripheral portion of the substrate. This makes it possible to distribute the liquid organic solvent over the entire upper surface of the substrate. Therefore, the organic solvent liquid film can be retained in the puddle-like form on the upper surface of the substrate as covering the entire upper surface of the substrate in the puddling step to be performed subsequently to the first higher speed rotation step. Thus, the rinse liquid present on the upper surface of the substrate can be properly replaced with the liquid organic solvent on the entire upper surface of the substrate.

The substrate treatment method may further include a second higher speed rotation step of rotating the substrate at a second rotation speed after the puddling step in the organic solvent replacing step, the second rotation speed being higher than a rotation speed of the substrate observed in the puddling step.

In the puddling step, the centrifugal force acting on the liquid organic solvent present on the substrate is zero or small and, therefore, the organic solvent liquid film has a greater thickness. If the organic solvent liquid film has a greater thickness when the substrate temperature increasing step is performed, the thicker organic solvent liquid film should be levitated above the substrate, requiring a longer period for the removal of the organic solvent liquid film in the liquid film removing step.

According to this method, the second higher speed rotation step is performed before the substrate temperature increasing step is started after the organic solvent replacing step. In the second higher speed rotation step, the substrate is rotated at the second rotation speed to reduce the thickness of the organic solvent liquid film present on the substrate. As a result, the organic solvent liquid film levitated above the substrate has a smaller thickness in the substrate temperature increasing step to be performed subsequently to the second higher speed rotation step. This reduces the period of the liquid film removing step.

The substrate temperature increasing step may be performed without rotating the substrate.

According to this method, the substrate temperature increasing step is performed while the rotation of the substrate is stopped.

If the substrate is rotated in the substrate temperature increasing step, the rotation speed of the peripheral portion of the substrate would be higher and, therefore, the peripheral portion would be cooled. As a result, it would be impossible to increase the temperature of the peripheral portion of the upper surface of the substrate to the desired temperature level (i.e., the first temperature level). In this case, it would be impossible to properly levitate the organic solvent liquid film above the peripheral portion of the substrate.

In the inventive method, in contrast, the substrate temperature increasing step is performed without rotating the substrate, so that the temperature of the peripheral portion of the upper surface of the substrate can be increased to the desired temperature level (first temperature level). Thus, the organic solvent liquid film can be levitated over the entire upper surface of the substrate.

The substrate treatment method may further include a substrate heating step of heating the substrate in the organic solvent replacing step so that the temperature of the upper surface of the substrate becomes a predetermined second temperature level lower than the boiling point of the organic solvent.

According to this method, the substrate is heated in the organic solvent replacing step. That is, the upper surface of the substrate is warmed, so that the liquid organic solvent present in contact with the upper surface of the substrate has an increased diffusion coefficient. This improves the efficiency of the replacement with the organic solvent. With a higher efficiency of the replacement in the organic solvent replacing step, the period of the organic solvent replacing step is reduced.

The substrate treatment method may further include a rinsing step of supplying a rinse liquid to the upper surface of the substrate prior to the organic solvent replacing step, and the substrate heating step may be started in the rinsing step.

The first temperature level in the substrate temperature increasing step may be a temperature such that the organic solvent liquid film levitated in the substrate temperature increasing step is prevented from boiling. In this case, the levitated organic solvent liquid film is substantially prevented from being split. Thus, the collapse of the pattern, the formation of water marks and other defects can be effectively suppressed or prevented which may otherwise occur due to the splitting of the organic solvent liquid film after a drying step.

The first temperature level in the substrate temperature increasing step may be a temperature higher by 10° C. to 50° C. than the boiling point of the organic solvent.

At least one of the first temperature level in the substrate temperature increasing step and the period of the substrate temperature increasing step may be determined so that organic solvent vapor contained in the organic solvent vapor film is prevented from breaking through the organic solvent liquid film to above the organic solvent liquid film. In this case, the splitting of the levitated organic solvent liquid film is effectively suppressed or prevented. Thus, the collapse of the pattern, the formation of water marks and other defects can be suppressed or prevented which may otherwise occur due to the splitting of the organic solvent liquid film after the drying step.

The thickness of the organic solvent liquid film levitated in the substrate temperature increasing step may be determined so that disintegration of the organic solvent liquid film is prevented in the substrate temperature increasing step. According to this method, the splitting of the levitated organic solvent liquid film is suppressed or prevented. Thus, the collapse of the pattern, the formation of water marks and other defects can be effectively suppressed or prevented which may otherwise occur due to the splitting of the organic solvent liquid film after the drying step.

The substrate treatment method may further include an organic solvent supplying step of supplying the organic solvent to the upper surface of the substrate in the substrate temperature increasing step.

According to this method, the thickness of the organic solvent liquid film levitated above the substrate can be maintained to a desired thickness in the organic solvent replacing step. Thus, the collapse of the pattern, the formation of water marks and other defects can be effectively suppressed or prevented which may otherwise occur due to the splitting of the organic solvent liquid film after the drying step.

According to the present invention, there is further provided a substrate treatment apparatus which performs a rinsing step to rinse a substrate with a rinse liquid, the apparatus including: a substrate holding unit which horizontally holds the substrate; an organic solvent supplying unit which supplies an organic solvent having a lower surface tension than the rinse liquid to an upper surface of the substrate held by the substrate holding unit; a heating unit which heats the substrate from below; and a control unit which controls the organic solvent supplying unit and the heating unit to perform an organic solvent replacing step of supplying the organic solvent to the upper surface of the substrate whereby a liquid film of the organic solvent is formed on the substrate as covering the upper surface of the substrate to replace the rinse liquid with the organic solvent, a substrate temperature increasing step of allowing the temperature of the upper surface of the substrate to reach a predetermined first temperature level higher than the boiling point of the organic solvent after the formation of the organic solvent liquid film, whereby a vapor film of the organic solvent is formed below the entire organic solvent liquid film between the organic solvent liquid film and the upper surface of the substrate to levitate the organic solvent liquid film above the organic solvent vapor film, and an organic solvent removing step of removing the organic solvent liquid film from above the substrate.

With this arrangement, the liquid organic solvent is supplied to the upper surface of the substrate to form the organic solvent liquid film covering the upper surface of the substrate on the substrate, whereby the rinse liquid adhering to the upper surface of the substrate is replaced with the liquid organic solvent. Since the upper surface of the substrate is entirely covered with the organic solvent liquid film, the rinse liquid can be properly replaced with the organic solvent on the entire upper surface of the substrate. After the formation of the organic solvent liquid film, the temperature of the upper surface of the substrate is allowed to reach the first temperature level. Thus, the organic solvent vapor film is formed on the entire upper surface of the substrate between the organic solvent liquid film and the upper surface of the substrate, and the organic solvent liquid film is levitated above the organic solvent vapor film. In this state, the magnitude of a frictional force occurring between the upper surface of the substrate and the organic solvent liquid film is generally zero, so that the organic solvent liquid film can be easily moved along the upper surface of the substrate.

In the organic solvent removing step, a force for moving the organic solvent liquid film laterally of the substrate acts on the organic solvent liquid film. Thus, the organic solvent liquid film is moved along the upper surface of the substrate to be expelled from a peripheral portion of the substrate. The organic solvent liquid film is moved in the form of liquid mass (i.e., without disintegration into a multiplicity of liquid droplets), whereby the organic solvent liquid film can be smoothly completely removed from above the substrate.

Therefore, the organic solvent does not remain in the form of liquid droplets on the upper surface of the substrate after the removal of the organic solvent liquid film. That is, even if a minute pattern is provided on the upper surface of the substrate, the liquid organic solvent does not remain in gaps of the minute pattern. Therefore, even where the substrate having the minute pattern on the upper surface thereof is treated, it is possible to properly dry the upper surface of the substrate while suppressing or preventing the collapse of the pattern.

The foregoing and other objects, features and effects of the present invention will become more apparent from the following detailed description of the preferred embodiments with reference to the attached drawings.

BRIEF DESCRIPTION OF THE DRAWINGS

FIG. 4 is a sectional view taken along a sectional plane IV-IV in

FIG. 3.

FIGS. 13A to 13I are schematic diagrams for explaining the first exemplary process.

DETAILED DESCRIPTION OF PREFERRED EMBODIMENTS

Figure 1:
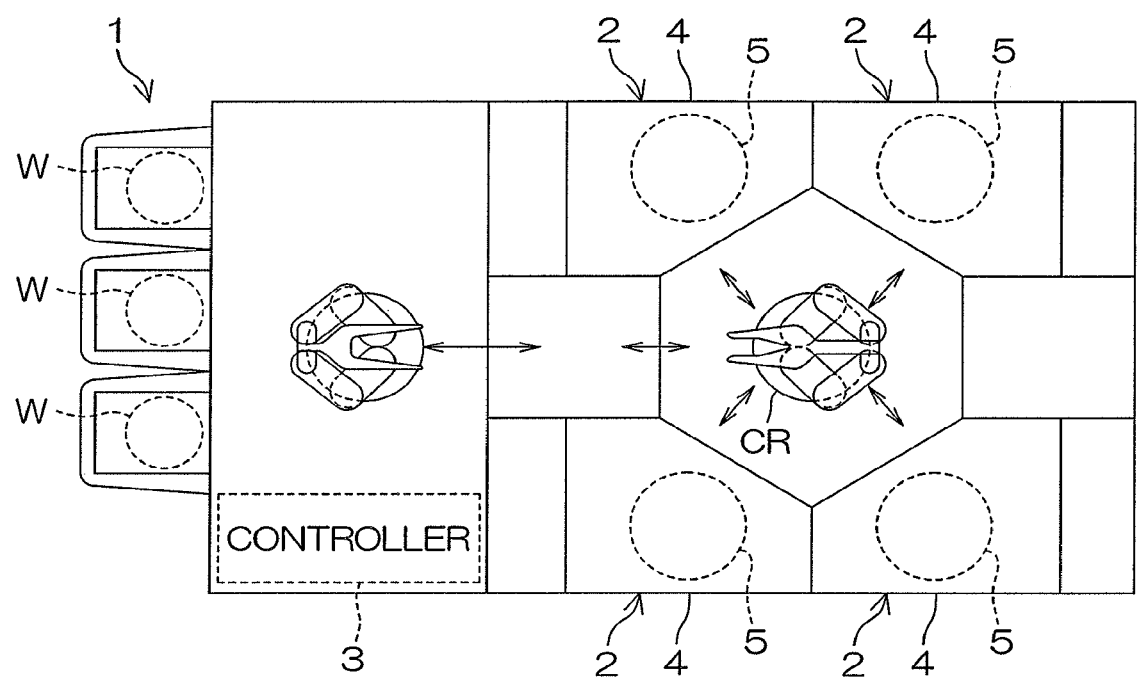
FIG. 1 is a schematic plan view showing the construction of a substrate treatment apparatus according to one embodiment of the present invention.
Figure 2:
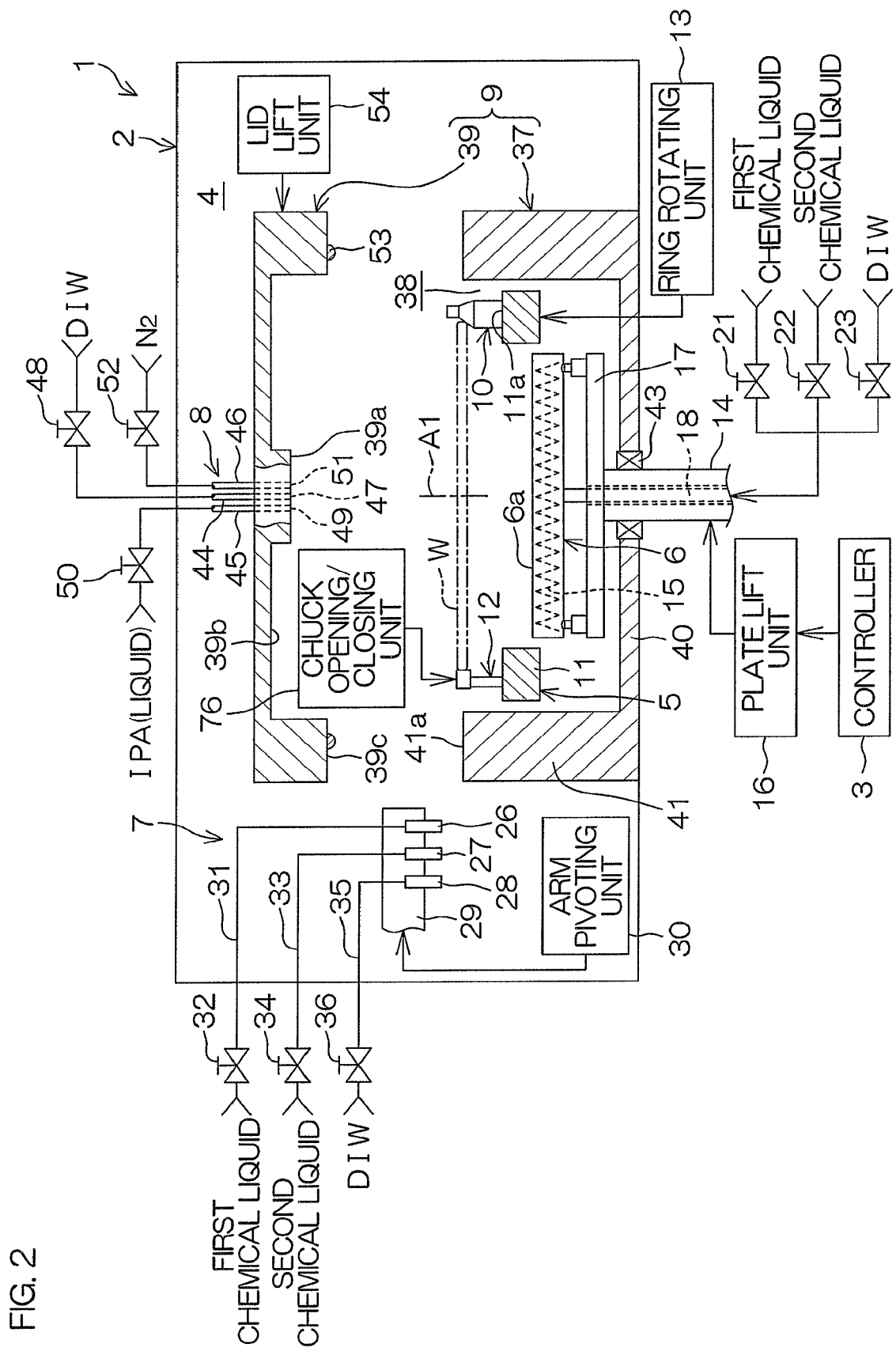
FIG. 2 is a sectional view showing the inside of a chamber provided in the substrate treatment apparatus shown in FIG. 1.

FIG. 1 is a schematic plan view showing the construction of a substrate treatment apparatus 1 according to one embodiment of the present invention. FIG. 2 is a vertical sectional view showing the inside of a chamber 4 provided in the substrate treatment apparatus 1.

As shown in FIG. 1, the substrate treatment apparatus 1 is of a single substrate treatment type adapted to treat a single disk-shaped substrate W (e.g., semiconductor wafer) at a time. The substrate treatment apparatus 1 includes a plurality of treatment units 2 which are each adapted to treat a substrate W with a treatment liquid or a treatment gas, a substrate transport robot CR which loads and unloads a substrate W with respect to a chamber 4 of each of the treatment units 2, and a controller (control unit) 3 which controls the operations of devices provided in the substrate treatment apparatus 1 and the opening and closing of valves.

The treatment units 2 are of a single substrate treatment type adapted to treat a front surface (pattern formation surface) and a back surface of the round substrate W with a first chemical liquid and a second chemical liquid for chemical liquid treatments (a cleaning treatment, an etching treatment and the like). The treatment units 2 each include a box-shaped chamber 4 having an inside space, a substrate holding and rotating unit (substrate holding unit) 5 which, while horizontally holding a single substrate W in the chamber 4, rotates the substrate W about a vertical rotation axis A1 extending through the center of the substrate W, a hot plate (substrate holding unit, heating unit) 6 which has a substrate opposing surface 6a for heating the substrate W from below and supports the substrate W from below in contact with a lower surface of the substrate W, a hot plate attitude shifting unit 90 (see FIG. 4) which shifts the hot plate 6 between a horizontal attitude and an inclined attitude, a treatment liquid supplying unit 7 which supplies the treatment liquid such as the first chemical liquid, the second chemical liquid, a rinse liquid or the like to the substrate W held by the substrate holding and rotating unit 5, an organic solvent supplying unit 8 which supplies liquid IPA as an exemplary organic solvent having a lower surface tension than the rinse liquid to the upper surface of the substrate W held by the substrate holding and rotating unit 5 or the hot plate 6, and a cup 9 which is capable of accommodating the substrate holding and rotating unit 5 and the hot plate 6 in a sealed state.

Figure 3:
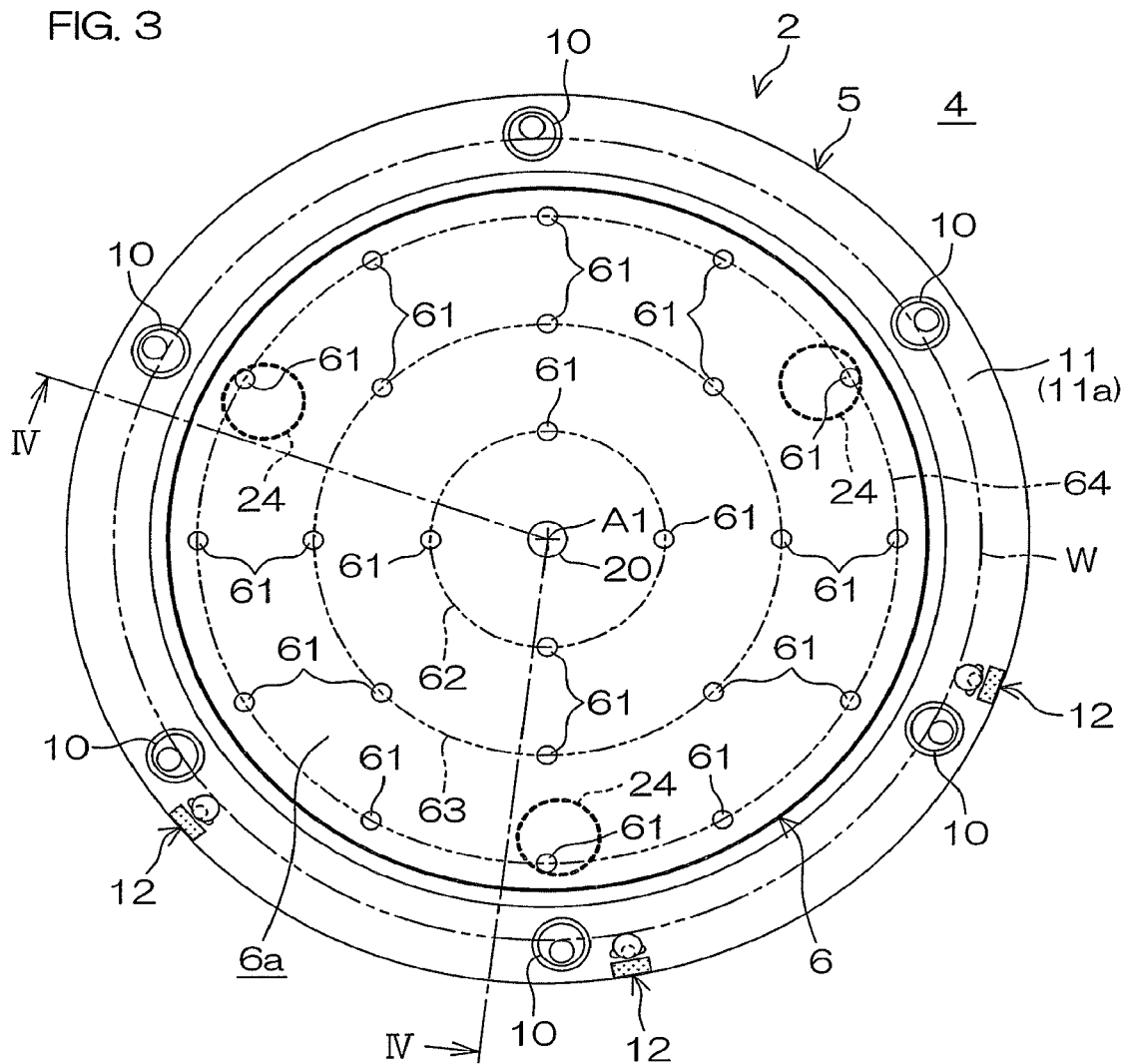
FIG. 3 is a plan view of a substrate holding and rotating unit and a hot plate shown in FIG. 2.
Figure 4:
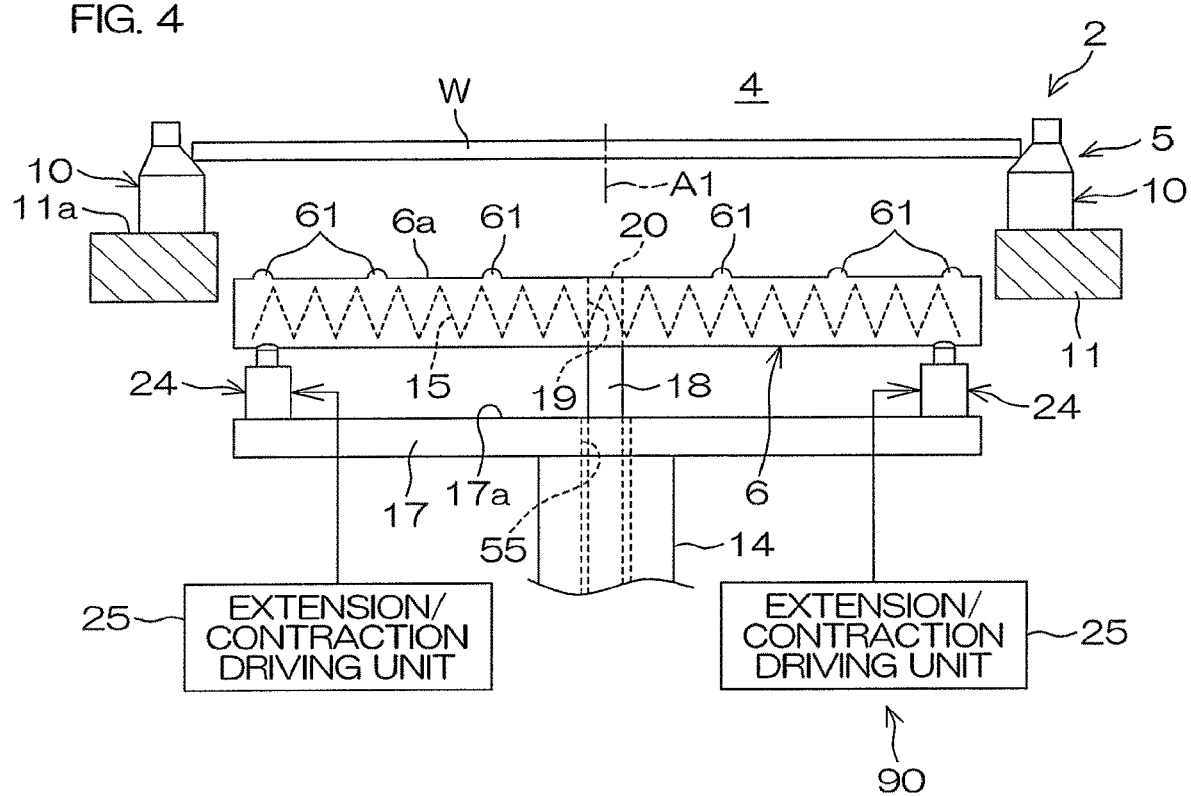

FIG. 3 is a plan view of the substrate holding and rotating unit 5 and the hot plate 6. FIG. 4 is a sectional view taken along a sectional plane IV-IV in FIG. 3.

As shown in FIGS. 2 to 4, the substrate holding and rotating unit 5 includes an annular support ring 11 having a slightly greater outer diameter than the substrate W. The support ring 11 is made of a resin material having a chemical resistance, and has a rotation center concentric with the rotation axis A1 of the substrate W. The support ring 11 has an annular upper surface 11a which is horizontal and flat. A plurality of fixed pins 10 (e.g., six fixed pins) immovable with respect to the support ring 11 and a plurality of movable pins 12 (e.g., three movable pins) which are smaller in number than the fixed pins 10 and movable with respect to the support ring 11 are provided on the upper surface 11a.

The plural fixed pins 10 are circumferentially equidistantly arranged on the upper surface 11a of the support ring 11. The plural movable pins 12 are circumferentially arranged on the upper surface 11a of the support ring 11. The movable pins 12 are provided in one-to-one correspondence with the same number of fixed pins 10 (e.g., three fixed pins 10) disposed adjacent to the movable pins 12. The movable pins 12 are disposed adjacent to the corresponding fixed pins 10. That is, the movable pins 12 are disposed locally circumferentially of the support ring 11.

A ring rotating unit 13 for rotating the support ring 11 about the rotation axis A1 is connected to the support ring 11. The ring rotating unit 13 includes, for example, a motor, an associated transmission mechanism and the like.

As shown in FIGS. 2 to 4, the hot plate 6 is made of, for example, a ceramic material or silicon carbide (SiC), and has a disk shape. The hot plate 6 has a round flat substrate opposing surface 6a having a slightly smaller diameter than the substrate W. The substrate opposing surface 6a has a diameter smaller than the inner diameter of the support ring 11. That is, the hot plate 6 and the support ring 11 of the substrate holding and rotating unit 5 do not vertically overlap with each other. The hot plate 6 incorporates a heater 15 of, for example, a resistor type. The heater 15 is energized to generate heat to heat the entire hot plate 6 including the substrate opposing surface 6a.

As shown in FIG. 3, a multiplicity of minute embosses 61 (e.g., 24 embosses in FIG. 3) each having a generally hemispherical shape for supporting the substrate W from below in abutment against the substrate W are distributed on the substrate opposing surface 6a of the hot plate 6. The embosses 61 are arranged at a generally uniform density throughout the substrate opposing surface 6a. More specifically, four embosses 61 are equidistantly arranged on a first phantom circle 62 defined about the rotation axis A1. Eight embosses 61 are equidistantly arranged on a second phantom circle 63 concentric with the first phantom circle 62. Twelve embosses 61 are equidistantly arranged on a third phantom circle 64 concentric with the first phantom circle 62. The second and third phantom circles 63, 64 respectively have diameters that are about twice and about three times the diameter of the first phantom circle 62. The multiple embosses 61 have substantially the same diameter.

The substrate W is spaced a minute distance (which is equivalent to a height H to be described with reference to FIG. 5) from the substrate opposing surface 6a above the substrate opposing surface 6a with the lower surface thereof in abutment against the multiple embosses 61. The substrate W is supported on the hot plate 6 by a frictional force occurring between the multiple embosses 61 and the lower surface of the substrate W and, when the heater 15 generates heat in this state, the substrate opposing surface 6a also generates heat. The heat is applied to the substrate W through heat transfer by heat radiation, heat conduction through a fluid present in a space defined between the substrate opposing surface 6a and the substrate W, and heat conduction via the multiple embosses 61. Thus, the substrate W supported by the multiple embosses 61 is heated.

Figure 5:
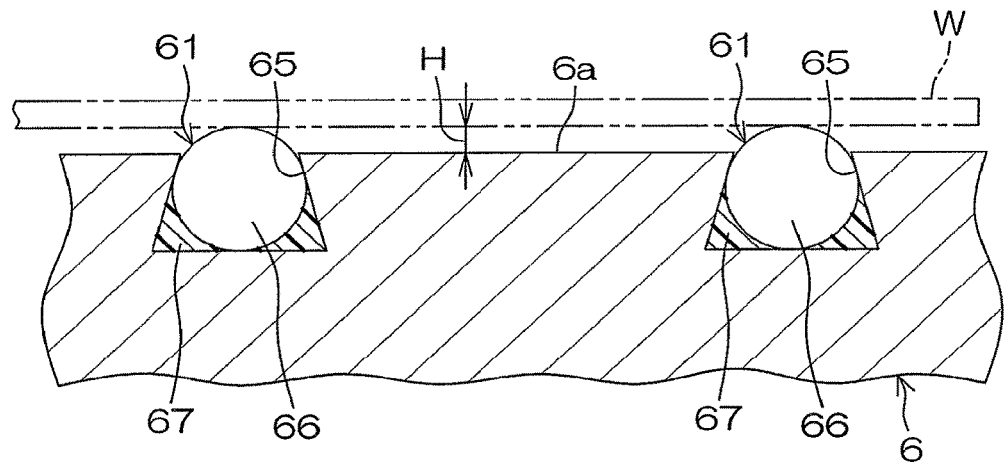
FIG. 5 is an enlarged vertical sectional view of a substrate opposing surface of the hot plate.

FIG. 5 is an enlarged vertical sectional view of the substrate opposing surface 6a of the hot plate 6.

Balls 66 are respectively engaged in a multiplicity of small cavities 65 distributively provided in the substrate opposing surface 6a, and the embosses 61 are respectively defined by upper portions of the balls 66 projecting upward from the corresponding small cavities 65. The balls 66 are fixed in the small cavities 65 with an adhesive agent 67.

The balls 66 are made of, for example, a ceramic material or silicon carbide (SiC). The multiple embosses 61 are formed as having a uniform height, for example. The embosses 61 each have a height H (e.g., about 0.1 mm) which is determined so that the substrate W supported by the multiple embosses 61 is prevented from being adsorbed on the substrate opposing surface 6a, and a contaminant present on the substrate opposing surface 6a is prevented from being transferred to the lower surface of the substrate W.

Therefore, the substrate W is supported in spaced relation from the substrate opposing surface 6a. Accordingly, the substrate W is substantially prevented from being adsorbed on the substrate opposing surface 6a and adhering to the substrate opposing surface 6a. Even if a contaminant is present on the substrate opposing surface 6a, the transfer of the contaminant to (the lower surface of) the substrate W is suppressed or prevented.

Since the substrate W is supported by the multiple embosses 61 distributed on the substrate opposing surface 6a, the heat transfer from the substrate opposing surface 6a to the substrate W can be kept uniform within the plane of the substrate W. Further, this suppresses or prevents warpage of the substrate W.

The multiple embosses 61 are not necessarily required to have a uniform height. For example, embosses 61 present on a center portion of the substrate opposing surface 6a may each have a smaller height than embosses 61 present on a peripheral portion of the substrate opposing surface 6a. That is, the peripheral embosses 61 may be higher than the center embosses 61 on the substrate opposing surface 6a.

As shown in FIGS. 2 and 4, the hot plate 6 is supported from below by a vertical plate support shaft 14 via a plurality of extension units 24 (e.g., three extension units 24) and a disk-shaped or ring-shaped support member 17 (in FIG. 2, a disk-shaped support member 17). The support member 17 has a horizontal flat support surface 17a, and is fixed to an upper end of the plate support shaft 14. The plural extension units 24 (e.g., three extension units 24) are circumferentially equidistantly arranged on a peripheral portion of the support surface 17a of the support member 17. The three extension units 24 are disposed, for example, at the same circumferential positions as three fixed pins 10 arranged every other one of the six fixed pins 10 with respect to the circumference of the hot plate 6.

The extension units 24 are cylinders each including an extension rod extendable longitudinally thereof. The extension units 24 each have a length adjustable to a desired length within a range between a minimum length and a maximum length by extending and contracting the extension rod. The extension units 24 are each disposed with the length of the extension rod thereof extending vertically. The extension units 24 support the peripheral portion of the hot plate 6 from below. The extension units 24 have the same construction. Therefore, the extension units 24 have the same minimum length. The extension units 24 are each connected to an extension/contraction driving unit 25 which supplies a driving fluid for longitudinally extending and contracting the extension rod. In this embodiment, the extension unit 24 and the extension/contraction driving unit 25 are provided as separate members, but may be provided as a unitary member such as an electromagnetic actuator. In this embodiment, the hot plate attitude shifting unit 90 includes the support member 17, the extension units 24 and the extension/contraction driving units 25.

All the extension units 24 are ordinarily kept in a minimum state as shown in FIG. 4 and, therefore, have the same length. Thus, the hot plate 6 is kept in the horizontal attitude. In this state, the substrate opposing surface 6a of the hot plate 6 are kept horizontal. As will be described later, the substrate W is temporarily placed on the substrate opposing surface 6a. Even if the substrate W is placed on the substrate opposing surface 6a, the substrate W does not move but is kept still because of the frictional force of the embosses 61 as described above.

Figure 16:
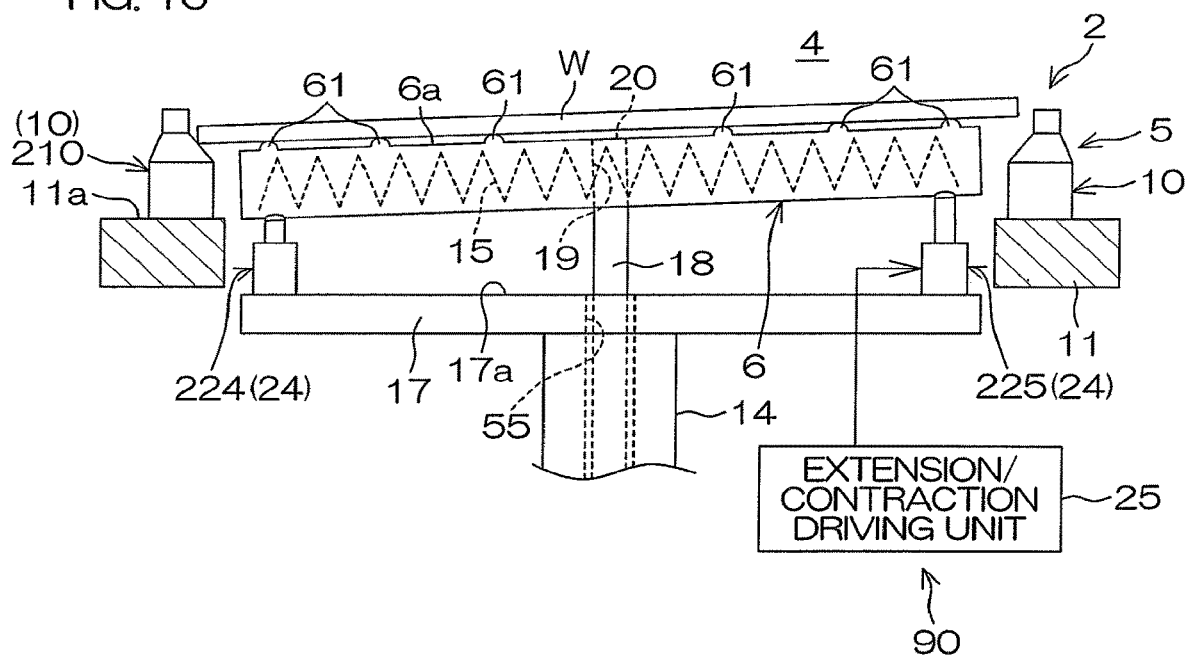
FIG. 16 is a vertical sectional view of the substrate holding and rotating unit and the hot plate as seen horizontally in an organic solvent removing step.

As shown in FIG. 16 to be described later, the length of one of the three extension units 24 is kept unchanged and the lengths of the other two extension units 24 are increased, whereby the hot plate 6 is shifted from the horizontal attitude shown in FIG. 4 to the inclined attitude. With this simple arrangement, the hot plate 6 can be shifted between the horizontal attitude and the inclined attitude.

The plate support shaft 14 extends vertically. The plate support shaft 14 is a hollow shaft, and a power supply line (not shown) for power supply to the heater 15 and a lower pipe 18 are inserted through the inside of the plate support shaft 14.

The lower pipe 18 communicates with a lower outlet port 20 opening in the center portion of the substrate opposing surface 6a of the hot plate 6 through a first through-hole 55 extending thicknesswise through a center portion of the support member 17 and a second through-hole 19 extending thicknesswise through the center portion of the hot plate 6. At least a part of the lower pipe 18 adjacent to the lower outlet port 20 is formed of a flexible pipe. Hydrofluoric acid (an example of the first chemical liquid), APM (ammonia-hydrogen peroxide mixture, an example of the second chemical liquid) and the rinse liquid are selectively supplied to the lower pipe 18 through a lower first chemical liquid valve 21, a lower second chemical liquid valve 22 and a lower rinse liquid valve 23. The rinse liquid is, for example, pure water (deionized water). The rinse liquid is not limited to the pure water, but may be carbonated water, electrolytic ion water, hydrogen water, ozone water or a hydrochloric acid aqueous solution having a dilute concentration (e.g., about 10 to about 100 ppm). The first and second chemical liquids and the rinse liquid supplied to the lower pipe 18 are spouted upward from the lower outlet port 20 through the inside of the second through-hole 19.

More specifically, the first chemical liquid is spouted upward from the lower outlet port 20 when the lower first chemical liquid valve 21 is opened with the lower second chemical liquid valve 22 and the lower rinse liquid valve 23 being closed. With the substrate W being held by the substrate holding and rotating unit 5, the first chemical liquid is supplied to a center portion of the lower surface of the substrate W.

Similarly, the second chemical liquid is spouted upward from the lower outlet port 20 when the lower second chemical liquid valve 22 is opened with the lower first chemical liquid valve 21 and the lower rinse liquid valve 23 being closed. With the substrate W being held by the substrate holding and rotating unit 5, the second chemical liquid is supplied to the center portion of the lower surface of the substrate W.

Further, the rinse liquid is spouted upward from the lower outlet port 20 when the lower rinse liquid valve 23 is opened with the lower first chemical liquid valve 21 and the lower second chemical liquid valve 22 being closed. With the substrate W being held by the substrate holding and rotating unit 5, the rinse liquid is supplied to the center portion of the lower surface of the substrate W.

Where only one lower outlet port 20 is provided as shown in FIGS. 2 to 4, the outlet port is shared by the plural treatment liquids. The lower outlet port 20 may include a plurality of outlet ports. In this case, the different outlet ports may be used for the different treatment liquids.

A plate lift unit 16 (see FIG. 2) which moves up and down the plate support shaft 14 is connected to the plate support shaft 14. The plate lift unit 16 includes, for example, a ball screw and a motor. The plate support shaft 14 is moved up and down by driving the plate lift unit 16, whereby the plate support shaft 14, the plural extension units 24, the support member 17 and the hot plate 6 are collectively moved up and down. By the driving of the plate lift unit 16, the hot plate 6 is moved up and down between a lower position (indicated in FIG. 13A and the like) at which the hot plate 6 is significantly spaced downward from the lower surface of the substrate W held by the substrate holding and rotating unit 5 (a height position at which at least the substrate opposing surface 6a of the hot plate 6 is located significantly below the lower surface of the substrate W held by the substrate holding and rotating unit 5, or a height position at which the lower surface of the substrate W is not significantly heated by the hot plate 6 when the hot plate 6 is constantly ON) and an upper position (indicated in FIG. 13G and the like) at which the substrate opposing surface 6a is located slightly below the lower surface of the substrate W held by the substrate holding and rotating unit 5). As described above, the hot plate 6 and the support ring 11 of the substrate holding and rotating unit 5 do not vertically overlap with each other and, therefore, do not interfere with each other during the up and down movement of the hot plate 6.

As shown in FIG. 2, the treatment liquid supplying unit 7 includes a first chemical liquid nozzle 26 which spouts the first chemical liquid, a second chemical liquid nozzle 27 which spouts the second chemical liquid, and a rinse liquid nozzle 28 which spouts the rinse liquid. The first chemical liquid nozzle 26, the second chemical liquid nozzle 27 and the rinse liquid nozzle 28 are attached to a distal portion of a generally horizontally extending arm 29 with their spouts directing downward. The arm 29 is pivotal about a predetermined rotation axis. The first chemical liquid nozzle 26, the second chemical liquid nozzle 27 and the rinse liquid nozzle 28 are juxtaposed in pivoting directions in which the arm 29 is pivoted. An arm pivoting unit 30 which pivots the arm 29 within a predetermined angular range is connected to the arm 29. By the pivoting of the arm 29, the nozzles 26 to 28 are moved between a position above the center portion of the substrate W supported by the substrate holding and rotating unit 5 or the hot plate 6 and a home position defined outside the cup 9.

As shown in FIG. 2, the first chemical liquid nozzle 26 is a straight nozzle which spouts hydrofluoric acid (an example of the first chemical liquid) downward in the form of continuous stream. A first chemical liquid line 31 serving as a first chemical liquid supply passage through which the first chemical liquid is supplied from a first chemical liquid supply source is connected to the first chemical liquid nozzle 26. A first chemical liquid valve 32 which opens and closes the first chemical liquid line 31 to switch on and off the supply of the first chemical liquid is provided in the first chemical liquid line 31. With the first chemical liquid valve 32 being open, the first chemical liquid is supplied from the first chemical liquid line 31 to the first chemical liquid nozzle 26. With the first chemical liquid valve 32 being closed, the supply of the first chemical liquid from the first chemical liquid line 31 to the first chemical liquid nozzle 26 is stopped.

As shown in FIG. 2, the second chemical liquid nozzle 27 is a straight nozzle which spouts APM (an example of the second chemical liquid) downward in the form of continuous stream. A second chemical liquid line 33 serving as a second chemical liquid supply passage through which the second chemical liquid is supplied from a second chemical liquid supply source is connected to the second chemical liquid nozzle 27. A second chemical liquid valve 34 which opens and closes the second chemical liquid line 33 to switch on and off the supply of the second chemical liquid is provided in the second chemical liquid line 33. With the second chemical liquid valve 34 being open, the second chemical liquid is supplied from the second chemical liquid line 33 to the second chemical liquid nozzle 27. With the second chemical liquid valve 34 being closed, the supply of the second chemical liquid from the second chemical liquid line 33 to the second chemical liquid nozzle 27 is stopped.

As shown in FIG. 2, the rinse liquid nozzle 28 is a straight nozzle which spouts the rinse liquid downward in the form of continuous stream. A rinse liquid line 35 serving as a rinse liquid supply passage through which the rinse liquid is supplied from a rinse liquid supply source is connected to the rinse liquid nozzle 28. A rinse liquid valve 36 which opens and closes the rinse liquid line 35 to switch on and off the supply of the rinse liquid is provided in the rinse liquid line 35. With the rinse liquid valve 36 being open, the rinse liquid is supplied from the rinse liquid line 35 to the rinse liquid nozzle 28. With the rinse liquid valve 36 being closed, the supply of the rinse liquid from the rinse liquid line 35 to the rinse liquid nozzle 28 is stopped.

In FIG. 2, the first and second chemical nozzles 26, 27 and the rinse liquid nozzle 28 are provided on the single arm 29, but may be respectively provided on different arms.

As shown in FIG. 2, the cup 9 includes a lower cup portion 37 which accommodates the substrate holding and rotating unit 5 and the hot plate 6, and a lid member 39 which closes an opening 38 of the lower cup portion 37. With the opening 38 of the lower cup portion 37 being closed by the lid member 39, a sealed cup having a sealed space defined therein is provided.

The lower cup portion 37 has a generally cylindrical container-like shape, and has a round top opening 38. The lower cup portion 37 integrally includes a generally disk-shaped bottom wall 40 and a peripheral wall 41 extending upright from the bottom wall 40. The peripheral wall 41 has a hollow cylindrical shape defined about the rotation axis A1. The peripheral wall 41 has an annular upper end surface 41a. One of opposite ends of a waste liquid passage (not shown) is connected to an upper surface of the bottom wall 40. The other end of the waste liquid passage is connected to an external waste liquid facility (not shown).

A capture cup (not shown) for capturing a treatment liquid scattered from the substrate W held by the substrate holding and rotating unit 5 or the hot plate 6 is provided around the peripheral wall 41. The capture cup is connected to the external waste liquid facility (not shown). A gap between the plate support shaft 14 and the center portion of the bottom wall 40 is sealed with an annular seal member 43.

The lid member 39 is provided in a generally horizontal attitude above the lower cup portion 37 with its center located on the rotation axis A1 of the substrate W. A lid lift unit 54 is connected to the lid member 39. The lid lift unit 54 includes, for example, a ball screw and a motor. By driving the lid lift unit 54, the lid member 39 is moved up and down between a lid closing position at which the lid member 39 closes the opening 38 of the lower cup portion 37 and a lid opening position at which the lid member 39 is retracted above the lower cup portion 37 to open the opening 38 of the lower cup portion 37. An upper annular recess 39b having a hollow cylindrical shape coaxial with the lid member 39 is provided in a region of the lower surface of the lid member 39 between a center portion 39a and a peripheral portion 39c.

The center portion 39a of the lower surface of the lid member 39 has a round horizontal flat surface. The center portion 39a of the lower surface of the lid member 39 is opposed to the center portion of the upper surface of the substrate W held by the substrate holding and rotating unit 5 or the center portion of the upper surface of the substrate W held by the hot plate 6.

A seal ring 53 is provided on the peripheral portion 39c of the lower surface of the lid member 39 as extending along the entire circumference. The seal ring 53 is made of, for example, an elastic resin material. With the lid member 39 located at the lid closing position, the seal ring 53 provided on the peripheral portion 39c of the lower surface of the lid member 39 abuts against the upper end surface 41a of the lower cup portion 37 along the entire circumference to seal a gap between the lid member 39 and the lower cup portion 37.

As shown in FIG. 2, an upper rinse liquid line 44, an upper organic solvent line 45 and an upper nitrogen gas line 46 vertically extend in adjacent relation to be inserted through the center portion 39a of the lid member 39.

A lower end of the upper rinse liquid line 44 opens in the center portion 39a of the lower surface of the lid member 39 to define a rinse liquid outlet port 47. An upstream end of the upper rinse liquid line 44 is connected to the rinse liquid supply source. The rinse liquid is supplied to the upper rinse liquid line 44 from the rinse liquid supply source. An upper rinse liquid valve 48 which opens and closes the upper rinse liquid line 44 to switch on and off the supply of the rinse liquid is provided in the upper rinse liquid line 44.

A lower end of the upper organic solvent line 45 opens in the center portion 39a of the lower surface of the lid member 39 to define an organic solvent outlet port 49. An upstream end of the upper organic solvent line 45 is connected to an IPA supply source. Liquid IPA is supplied to the upper organic solvent line 45 from the IPA supply source. An organic solvent valve 50 which opens and closes the upper organic solvent line 45 to switch on and off the supply of the liquid IPA is provided in the upper organic solvent line 45. The upper organic solvent line 45 and the organic solvent valve 50 constitute the organic solvent supplying unit 8.

A lower end of the upper nitrogen gas line 46 opens in the center portion 39a of the lower surface of the lid member 39 to define a nitrogen gas outlet port 51 through which nitrogen gas ($N_2$) is spouted as an exemplary inert gas. An upstream end of the upper nitrogen gas line 46 is connected to a nitrogen gas supply source. The nitrogen gas is supplied from the nitrogen gas supply source to the nitrogen gas outlet port 51 through the upper nitrogen gas line 46 which serves as a nitrogen gas supply passage. A nitrogen gas valve 52 which opens and closes the upper nitrogen gas line 46 to switch on and off the supply of the nitrogen gas is provided in the upper nitrogen gas line 46.

Figure 6:
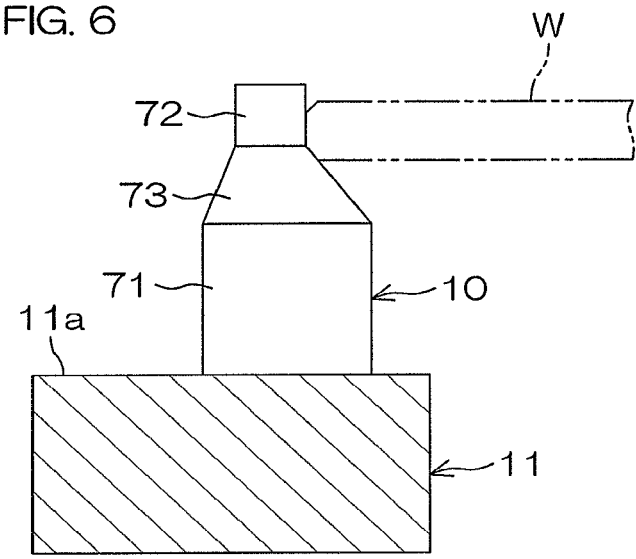
FIG. 6 is a sectional view schematically showing the structure of a fixed pin.

FIG. 6 is a sectional view schematically showing the structure of the fixed pin 10. As described with reference to FIG. 3, the plural fixed pins 10 are circumferentially equidistantly arranged on the upper surface 11a of the support ring 11. As illustrated in FIG. 6, the fixed pins 10 each include a first lower shaft portion 71 connected to the support ring 11, and a first upper shaft portion 72 integrally provided on an upper end of the first lower shaft portion 71. The first lower shaft portion 71 and the first upper shaft portion 72 each have a cylindrical shape. The first upper shaft portion 72 is eccentric from the center axis of the first lower shaft portion 71. A portion of the first lower shaft portion 71 connected to the first upper shaft portion 72 has a tapered surface 73 having a diameter progressively increased toward a lower side.

Figure 7:
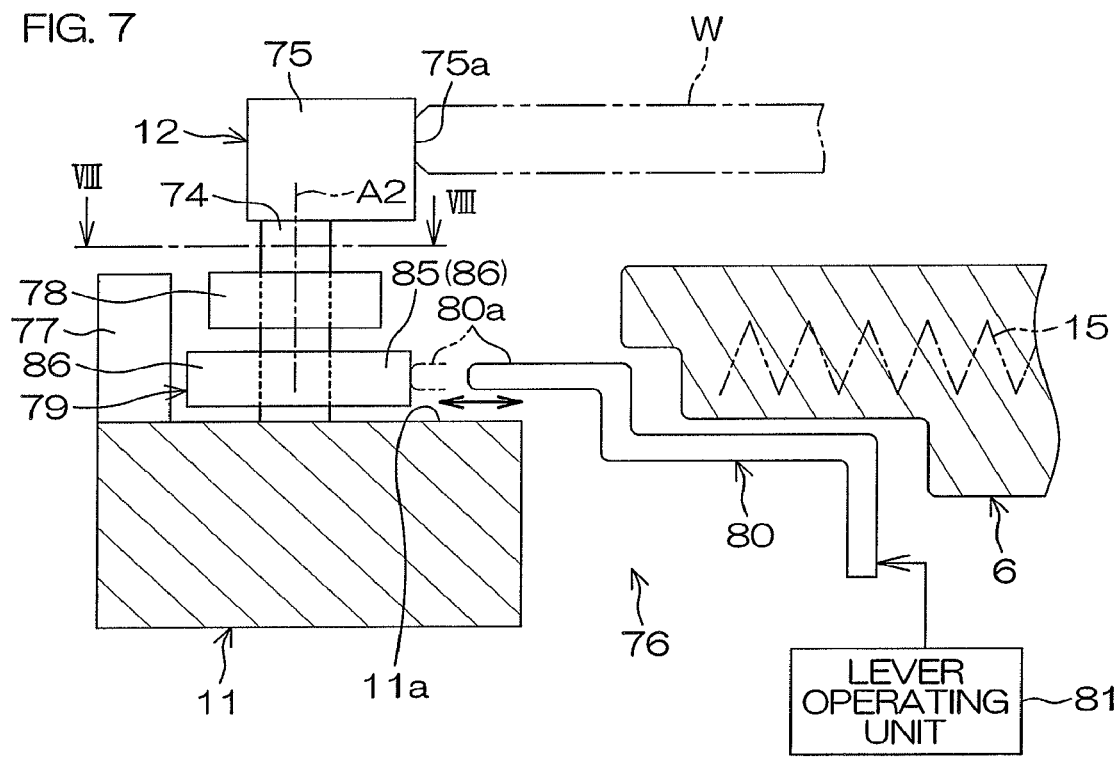
FIG. 7 is a sectional view schematically showing the structures of a movable pin and a chuck opening/closing unit.

FIG. 7 is a sectional view schematically showing the movable pin 12 and an arrangement around the movable pin 12. The movable pins 12 each include a second lower shaft portion 74 extending vertically and connected to the support ring 11 so as to be rotatable about a rotation axis A2, and a second upper shaft portion 75 fixed to the second lower shaft portion 74 with its center axis being eccentric from the rotation axis A2. The second upper shaft portion 75 has a cylindrical surface 75a to be brought into abutment against a peripheral edge of the substrate W. By the rotation of the second lower shaft portion 74, the cylindrical surface 75a of the second upper shaft portion 75 is shifted between an unclamping position at which the cylindrical surface 75a is located away from the rotation axis A1 (see FIG. 2) of the substrate W and a clamping position at which the cylindrical surface 75a is located closer to the rotation axis A1. The movable pins 12 each include a chuck opening/closing unit 76. The chuck opening/closing unit 76 shifts the second upper shaft portion 75 between the unclamping position and the clamping position to clamp and unclamp the substrate W.

As shown in FIG. 6, the peripheral edge of the substrate W abuts against the tapered surfaces 73 of the respective fixed pins 10 with the substrate W supported from below by the plural fixed pins 10. In this state, the second upper shaft portions 75 of the respective movable pins 12 are each shifted from the unclamping position to the clamping position shown in FIG. 7. When the second upper shaft portions 75 are each shifted from the unclamping position to the clamping position, the cylindrical surfaces 75a are brought into abutment against the peripheral edge of the substrate W, and press the abutting peripheral edge portions of the substrate W inward of the substrate W. Thus, peripheral edge portions of the substrate W opposite from the abutting peripheral edge portions of the substrate W with respect to the rotation axis A1 are brought into abutment against the first upper shaft portions 72 of the fixed pins 10 located opposite from the movable pins 12 with respect to the rotation axis A1. By thus shifting the second upper shaft portions 75 of the respective movable pins 12 from the unclamping positions to the clamping positions, the movable pins 12 are brought into a clamping state. Thus, the substrate W is horizontally clamped by the fixed pins 10 and the movable pins 12.

The cylindrical surfaces 75a may be each formed with a V-shaped groove, which horizontally opens toward the rotation axis A1. In this case, the cylindrical surfaces 75a are not pressed against the peripheral edge of the substrate W, but upper and lower tapered surfaces of the V-shaped grooves are brought into abutment against the peripheral edge of the substrate W to clamp the substrate W.

Figure 8:
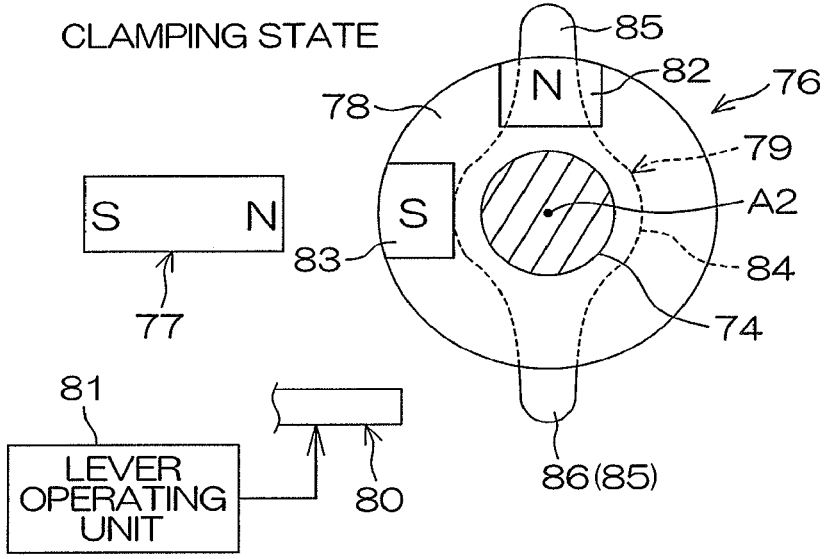
FIG. 8 is a schematic diagram showing the chuck opening/closing unit with the movable pin kept in a clamping state.
Figure 9:
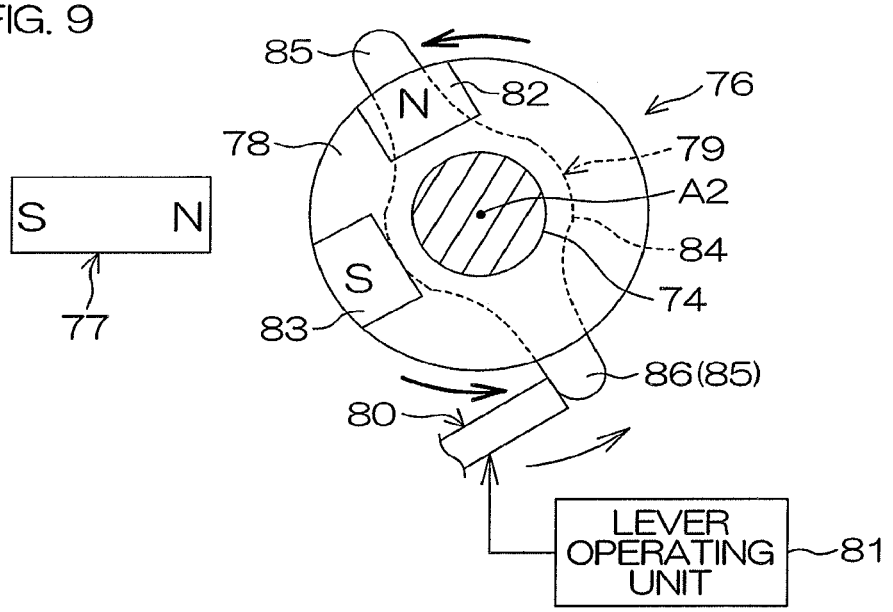
FIG. 9 is a schematic diagram showing the chuck opening/closing unit with the movable pin being shifted from the clamping state to an unclamping state.
Figure 10:
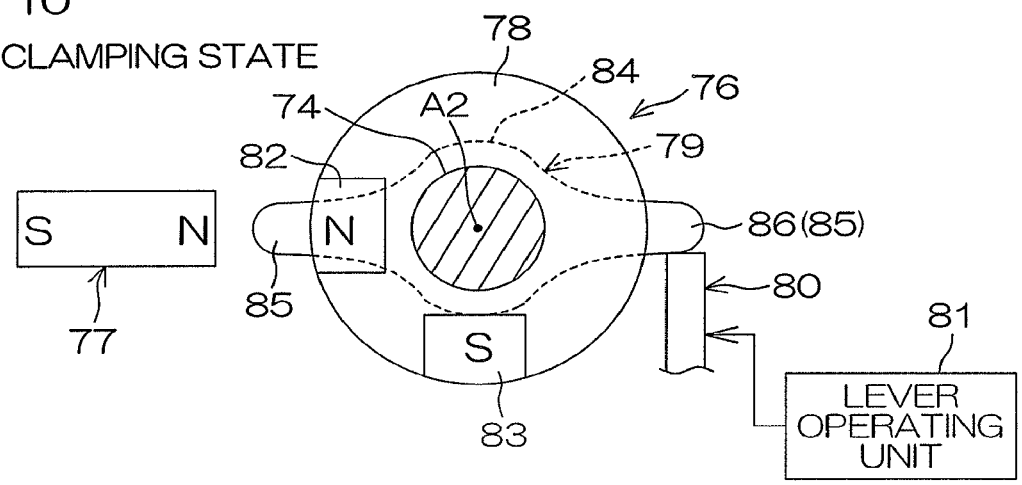
FIG. 10 is a schematic diagram showing the chuck opening/closing unit with the movable pin kept in the unclamping state.

FIGS. 8 to 10 are schematic diagrams showing the movement of the chuck opening/closing unit 76. FIGS. 8 to 10 are taken along a sectional plane VIII-VIII in FIG. 7. With reference to FIGS. 7 to 10, the construction of the chuck opening/closing unit 76 will be described.

The chuck opening/closing unit 76 includes a driving permanent magnet 77, a pin permanent magnet 78, an operation ring 79, an operation lever 80 and a lever operating unit 81.

The driving permanent magnet 77 is fixed onto the upper surface 11a on an outer side of the second lower shaft portion 74 of the movable pin 12 present on the upper surface 11a of the support ring 11, for example, with a magnetic pole orientation extending radially of the substrate holding and rotating unit 5. In this embodiment, more specifically, the driving permanent magnet 77 has an N-pole located on an inner side with respect to the rotation radius of the substrate holding and rotating unit 5, and an S-pole located on an outer side with respect to the rotation radius of the substrate holding and rotating unit 5.

The pin permanent magnet 78 has a thick annular shape or a cylindrical shape. The pin permanent magnet 78 is fitted around a middle portion of the second lower shaft portion 74 concentrically with the rotation axis A2 of the movable pin 12. The pin permanent magnet 78 includes an N-polarity portion 82 and an S-polarity portion 83 provided at different circumferential positions and respectively imparted with an N-polarity and an S-polarity. In this embodiment, the S-polarity portion 83 is offset from the N-polarity portion 82, for example, by about 90 degrees counterclockwise about the rotation axis A2 as seen in plan.

The operation ring 79 is fitted around the second lower shaft portion 74 below the pin permanent magnet 78 concentrically with the rotation axis A2 of the movable pin 12. The operation ring 79 includes a cylindrical portion 84, and a pair of projection pieces 85 sharply projecting radially outward from two different portions of the side wall of the cylindrical portion 84 offset from each other by 180 degrees. One of the pair of projection pieces 85 functions as a to-be-operated piece 86 to be brought into abutment against the operation lever 80 for operation. Another of the pair of projection pieces 85 of the operation ring 79 is located at the same circumferential position as the N-polarity portion 82 of the pin permanent magnet 78. The operation ring 79 is rotatable together with the pin permanent magnet 78.

The pin permanent magnet 78 has an outer peripheral surface opposed to the N-pole of the driving permanent magnet 77. The pin permanent magnet 78 is fixed to the second lower shaft portion 74 and, therefore, a portion of the outer peripheral surface of the pin permanent magnet 78 opposed to the N-pole of the driving permanent magnet 77 is changed as the second lower shaft portion 74 is rotated.

The operation lever 80 includes, for example, a rod-shaped distal portion 80a, and has a line shape as a whole. The operation lever 80 is slidable horizontally in a predetermined direction. As the operation lever 80 is moved, the distal portion 80a of the operation lever 80 is rotated about the rotation axis A2. The operation lever 80 extends radially outward of the hot plate 6 in a space below the hot plate 6 while approaching the lower surface of the hot plate 6. The lower surface of the hot plate 6 is stepped and, therefore, the operation lever 80 has a crank shape in conformity with the shape of the lower surface of the hot plate 6 so as not to contact the hot plate 6.

The lever operating unit 81 including a cylinder and the like is connected to the operation lever 80. By driving the lever operating unit 81, the operation lever 80 is horizontally slid between a retracted position (indicated in FIG. 8) at which the distal end 80a is retracted laterally of the to-be-operated piece 86 and a release position (indicated in FIG. 10) to be described later.

In FIG. 8, the movable pin 12 is illustrated as being in the clamping state. In FIG. 9, the movable pin 12 is illustrated as being shifted from the clamping state to the unclamping state. In FIG. 10, the movable pin 12 is illustrated as being in the unclamping state. In the clamping state of the movable pin 12 shown in FIG. 8, the second upper shaft portion 75 (see FIG. 7) is located at the clamping position (indicated in FIGS. 7 and 8). In the unclamping state of the movable pin 12 shown in FIG. 10, the second upper shaft portion 75 is located at the unclamping position (indicated in FIG. 10).

In the clamping state of the movable pin 12, as shown in FIGS. 8 to 10, the N-pole of the driving permanent magnet 77 and the S-polarity portion 83 of the pin permanent magnet 78 are opposed to each other. In the unclamping state of the movable pin 12, the N-pole of the driving permanent magnet 77 and the N-polarity portion 82 of the pin permanent magnet 78 are opposed to each other. The unclamping position (indicated in FIG. 10) of the second upper shaft portion 75 (see FIG. 7) is angularly offset from the clamping position (indicated in FIGS. 7 and 8) of the second upper shaft portion 75 by about 90 degrees counterclockwise about the rotation axis A2 as seen in plan.

In the clamping state of the movable pin 12 shown in FIG. 8, as described above, the N-pole of the driving permanent magnet 77 and the S-polarity portion 83 of the pin permanent magnet 78 are opposed to each other. In this case, a portion of the pin permanent magnet 78 opposed to the driving permanent magnet 77 has a polarity different from the polarity of the radially inward portion of the driving permanent magnet 77. Therefore, the driving permanent magnet 77 applies an attractive magnetic force radially to the pin permanent magnet 78. In the clamping state of the movable pin 12, therefore, the pin permanent magnet 78 is maintained in an attitude such that the S-polarity portion 83 is opposed to the driving permanent magnet 77, whereby the second upper shaft portion 75 is maintained at the clamping position (indicated in FIGS. 7 and 8). In the clamping state of the movable pin 12, the operation lever 80 is retracted to the retracted position (indicated in FIG. 8) by the lever operating unit 81.

When the movable pin 12 is to be shifted from the clamping state shown in FIG. 8 to the unclamping state shown in FIG. 10, the operation lever 80 is moved by the lever operating unit 81 as shown in FIG. 9 to bring the distal portion 80a of the operation lever 80 into abutment against the to-be-operated piece 86. Even after the abutment against the to-be-operated piece 86, the operation lever 80 is continuously moved by the lever operating unit 81. The distal portion 80a of the operation lever 80 is rotated counterclockwise about the rotation axis A2 as seen in plan, while being kept in abutment against the to-be-operated piece 86. Thus, the to-be-operated piece 86 is rotated about the rotation axis A2 against the attractive magnetic force occurring between the driving permanent magnet 77 and the pin permanent magnet 78, whereby the second lower shaft portion 74 and the second upper shaft portion 75 are rotated about the rotation axis A2 together with the to-be-operated piece 86. When the operation lever 80 is moved to the release position (indicated in FIG. 10), the second upper shaft portion 75 (see FIG. 7) is shifted to the unclamping position (indicated in FIG. 10), whereby the movable pin 12 is brought into the unclamping state.

In the unclamping state of the movable pin 12, as shown in FIG. 10, the N-pole of the driving permanent magnet 77 and the N-polarity portion 82 of the pin permanent magnet 78 are opposed to each other as described above. Further, the operation lever 80 is maintained at the release position by the lever operating unit 81. In this case, a portion of the pin permanent magnet 78 opposed to the driving permanent magnet 77 has the same polarity as the radially inward portion of the driving permanent magnet 77. In this state, the driving permanent magnet 77 applies a repulsive magnetic force to the pin permanent magnet 78 in a circumferential direction. However, the operation lever 80 maintained at the release position is engaged with the to-be-operated piece 86, thereby preventing the rotation of the second upper shaft portion 75 and the to-be-operated piece 86. Therefore, the second upper shaft portion 75 (see FIG. 7) is maintained at the unclamping position (indicated in FIG. 10).

When the movable pin 12 is to be shifted from the unclamping state shown in FIG. 10 to the clamping state shown in FIG. 8, the operation lever 80 is moved back to the retracted position (indicated in FIG. 8) by the lever operating unit 81. With the second upper shaft 75 (see FIG. 7) being located at the unclamping position (indicated in FIG. 10), as described above, the repulsive magnetic force occurs between the driving permanent magnet 77 and the pin permanent magnet 78. More specifically, a force is applied to the pin permanent magnet 78 clockwise as seen in plan. Therefore, when the distal portion 80a of the operation lever 80 and the to-be-operated piece 86 are disengaged from each other by moving the operation lever 80 back to the retracted position (indicated in FIG. 8), the pin permanent magnet 78 is rotated clockwise as seen in plan. Thus, the second upper shaft portion 75 (see FIG. 7) is shifted from the unclamping position (indicated in FIG. 10) to the clamping position (indicated in FIGS. 7 and 8), whereby the movable pin 12 is brought into the clamping state.

Alternatively, the driving permanent magnet 77 may have an S-pole located on the inner side with respect to the rotation radius, and an N-pole located on the outer side with respect to the rotation radius.

In the foregoing description, the repulsive magnetic force occurs between the driving permanent magnet 77 and the pin permanent magnet 78 when the second upper shaft portion 75 (see FIG. 7) is located at the unclamping position (indicated in FIG. 10), and the attractive magnetic force occurs between the driving permanent magnet 77 and the pin permanent magnet 78 when the second upper shaft portion 75 is located at the clamping position (indicated in FIGS. 7 and 8) by way of example. Alternatively, the movable pin 12 may be configured so that the attractive magnetic force occurs between the driving permanent magnet 77 and the pin permanent magnet 78 when the second upper shaft portion 75 is located at the unclamping position, and the repulsive magnetic force occurs between the driving permanent magnet 77 and the pin permanent magnet 78 when the second upper shaft portion 75 is located at the clamping position.

The controller 3 shown in FIG. 1 includes, for example, a microcomputer. The controller 3 controls the operations of the ring rotating unit 13, the extension/contraction driving units 25, the plate lift unit 16, the arm pivoting unit 30, the lid lift unit 54, the chuck opening/closing unit 76, the lever operating unit 81 and the like according to predetermined programs. Further, the controller 3 controls electric power to be supplied to the heater 15. In addition, the controller 3 controls the opening and closing of the lower first chemical liquid valve 21, the lower second chemical liquid valve 22, the lower rinse liquid valve 23, the first chemical liquid valve 32, the second chemical liquid valve 34, the rinse liquid valve 36, the upper rinse liquid valve 48, the organic solvent valve 50, the nitrogen gas valve 52 and the like.

Figure 11:
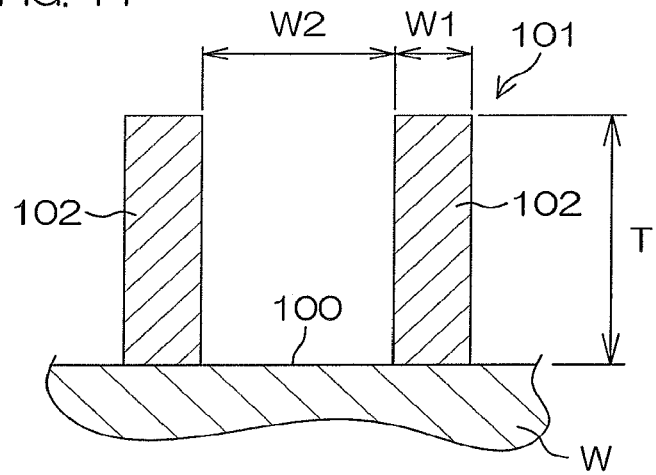
FIG. 11 is a sectional view showing a front surface of the substrate to be treated by a treatment unit on an enlarged scale.

FIG. 11 is a sectional view showing the front surface of the substrate W to be treated by the treatment unit 2 on an enlarged scale. The substrate W to be treated is, for example, a silicon wafer, and includes a minute pattern 101 provided on the front surface (upper surface 100) which is a pattern formation surface. The minute pattern 101 may include projecting (columnar) structures 102 arranged in a matrix array as shown in FIG. 11. In this case, the structures 102 of the minute pattern 101 each have a line width W1 of, for example, about 10 nm to about 45 nm, and are arranged with a gap W2 of, for example, about 10 nm to several micrometers.

The minute pattern 101 may include linear structures arranged in a repeated pattern defined by minute trenches.

Alternatively, the minute pattern 101 may be formed by forming a plurality of minute holes (voids or pores) in a thin film.

The minute pattern 101 includes, for example, an insulation film. The minute pattern 101 may include an electrically conductive film. More specifically, the minute pattern 101 may be formed of a layered film including a plurality of films stacked one on another, and may include an insulation film and an electrically conductive film. Alternatively, the minute pattern 101 may be a pattern formed of a single-layer film. The insulation film may be a silicon oxide film ($SiO_2$ film) or a silicon nitride film (SiN film). The electrically conductive film may be an amorphous silicon film doped with an impurity for reduction of resistance, or may be a metal film (e.g., a metal interconnection film).

The minute pattern 101 has a thickness T of, for example, about 50 nm to about 5 μm. The minute pattern 101 may have an aspect ratio (a ratio of the thickness T to the line width W1) of, for example, about 5 to about 500 (typically about 5 to about 50).

Figure 12:
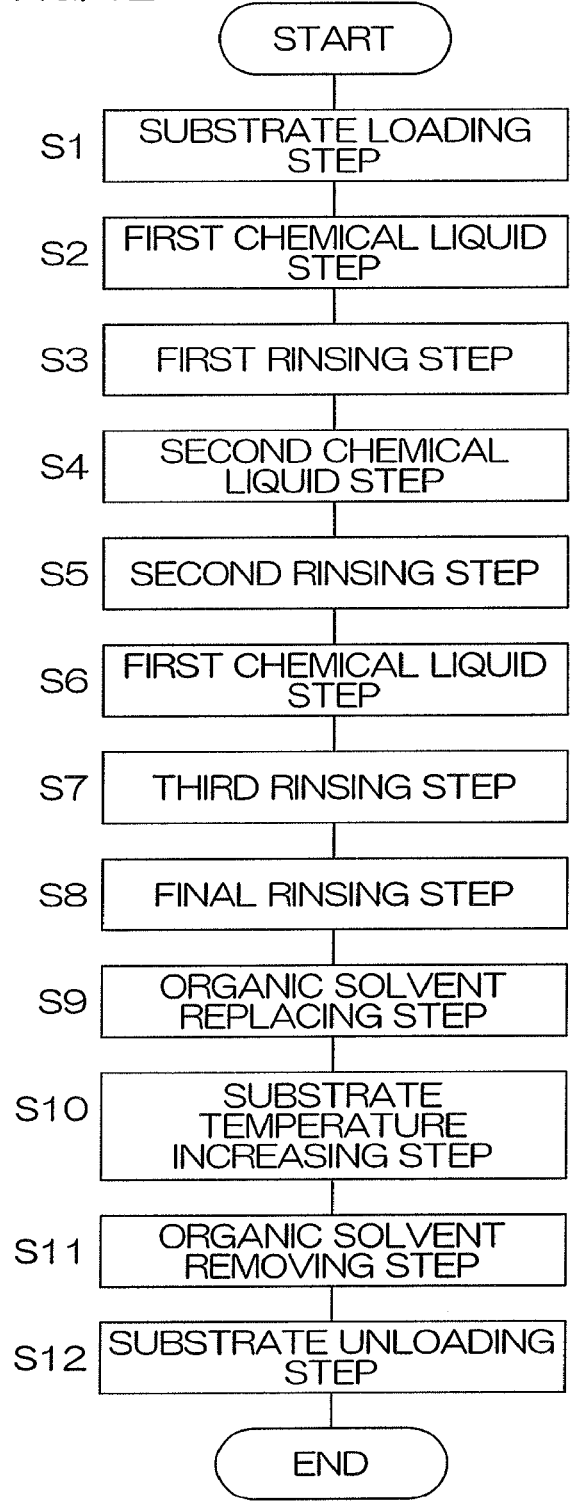
FIG. 12 is a process diagram for explaining a first exemplary process for a chemical liquid treatment to be performed by the treatment unit.
Figure 13A:
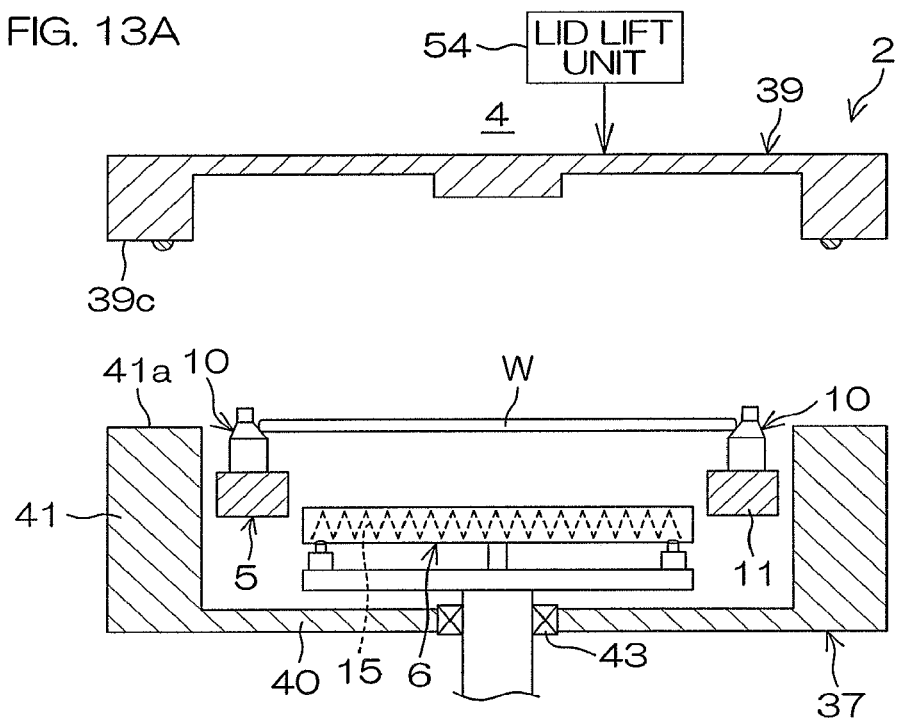
Figure 17:
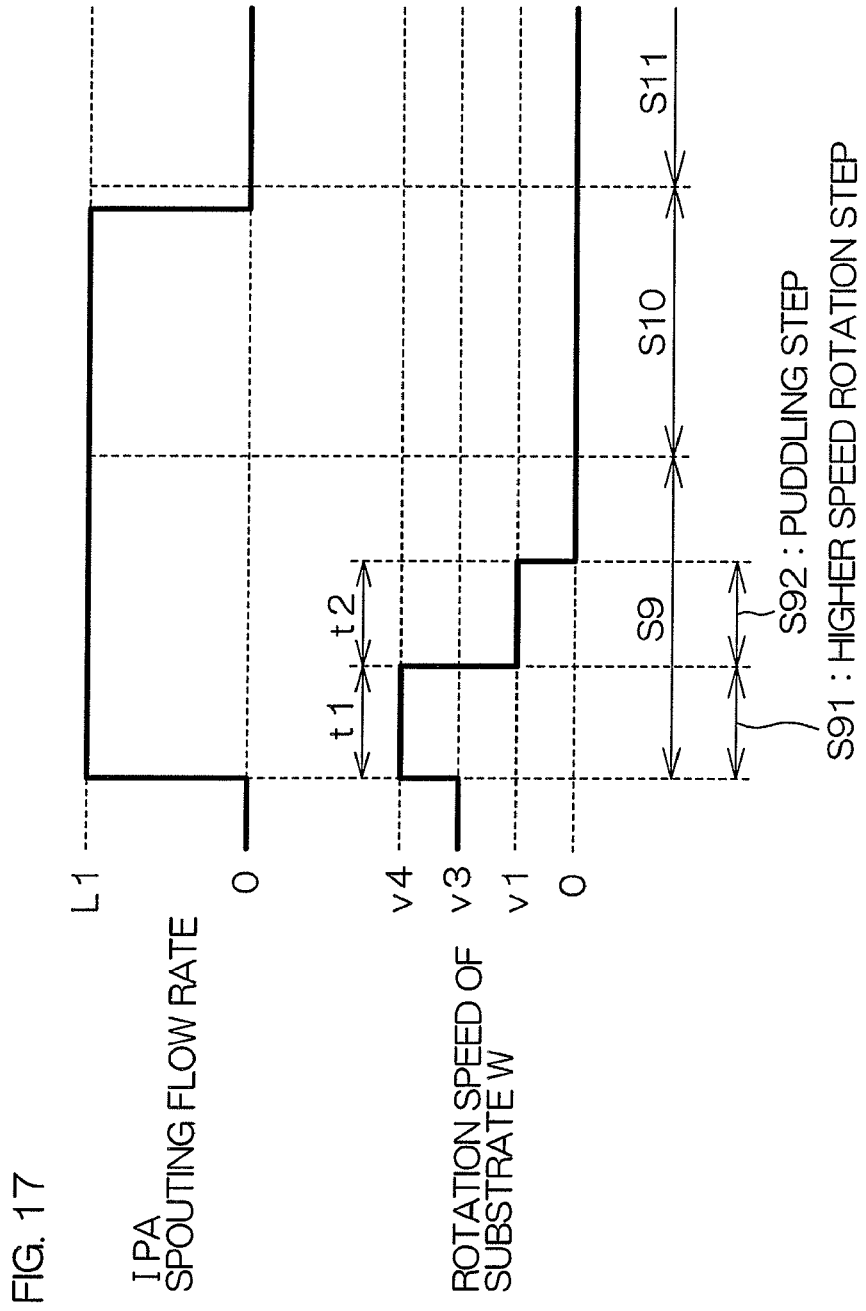
FIG. 17 is a diagram showing a change in IPA spouting flow rate and a change in substrate rotation speed in an organic solvent replacing step, the substrate temperature increasing step and the organic solvent removing step.

FIG. 12 is a process diagram for explaining a first exemplary process for the chemical liquid treatment to be performed by the treatment unit 2. FIGS. 13A to 13I are schematic diagrams for explaining the first exemplary process. FIGS. 14A to 14D are schematic sectional views for explaining states of the upper surface of the substrate W observed in the first exemplary process. FIGS. 15 and 16 are vertical sectional views of the substrate holding and rotating unit 5 and the hot plate 6 as seen horizontally. FIG. 15 illustrates a substrate temperature increasing step (S10), and FIG. 16 illustrates an organic solvent removing step (S11). FIG. 17 is a diagram showing a change in IPA spouting flow rate and a change in substrate rotation speed in an organic solvent replacing step (S9), the substrate temperature increasing step (S10) and the organic solvent removing step (S11).

Reference will hereinafter be made to FIGS. 1 and 2. Reference will be also made to FIGS. 11 to 17 as required. In the following description, "the front surface (upper surface) of the substrate W" includes the front surface (upper surface) of the substrate W itself as well as the front surface (upper surface) of the minute pattern 101.

When the substrate treatment is to be performed by the treatment unit 2, a substrate loading step (Step S1 in FIG. 12) is performed to load an untreated substrate W into the chamber 4. Prior to the substrate loading step (S1), the controller 3 turns on the heater 15 (into an energized state), and locates the hot plate 6 at the lower position at which the hot plate 6 is retracted downward from the substrate holding position at which the substrate W is held by the substrate holding and rotating unit 5. Further, the controller 3 retracts all the nozzles from above the substrate holding and rotating unit 5. The controller 3 brings all the movable pins 12 into the unclamping state.

In the substrate loading step (S1), the controller 3 causes the substrate transport robot CR (see FIG. 1) to insert its hands into the chamber 4 with the substrate W held by the hands, and to transfer the substrate W to the substrate holding and rotating unit 5 with the pattern formation surface (front surface) facing up. The substrate W transferred to the substrate holding and rotating unit 5 is supported by the plural fixed pins 10 from below. Then, the controller 3 brings the plural movable pins 12 into the clamping state. Thus, as shown in FIG. 13A, the substrate W is horizontally clamped by the plural fixed pins 10 (e.g., six fixed pins 10) and the plural movable pins 12 (e.g., three movable pins 12) (in FIG. 13A, only the fixed pins 10 are shown). The controller 3 causes the substrate transport robot CR to retract its hands from the chamber 4 after transferring the substrate W to the substrate holding and rotating unit 5.

After the substrate W is clamped by the plural fixed pins 10 and the plural movable pins 12, the controller 3 controls the ring rotating unit 13 to start rotating the substrate W. The rotation speed of the substrate W is increased to a predetermined liquid treatment rotation speed v3 (see FIG. 17, e.g., about 100 to about 1500 rpm) and maintained at the liquid treatment rotation speed v3.

Although the heater 15 is turned on in the substrate loading step (S1) and, hence, the hot plate 6 is kept in the heat generating state (at this time, the substrate opposing surface has a surface temperature of, for example, about 60° C. to about 250° C.), the heat generated by the hot plate 6 located at the lower position does not sufficiently reach the substrate W.

In turn, a first chemical liquid step (Step S2 in FIG. 12) is performed to supply the first chemical liquid to the substrate W.

Figure 13B:
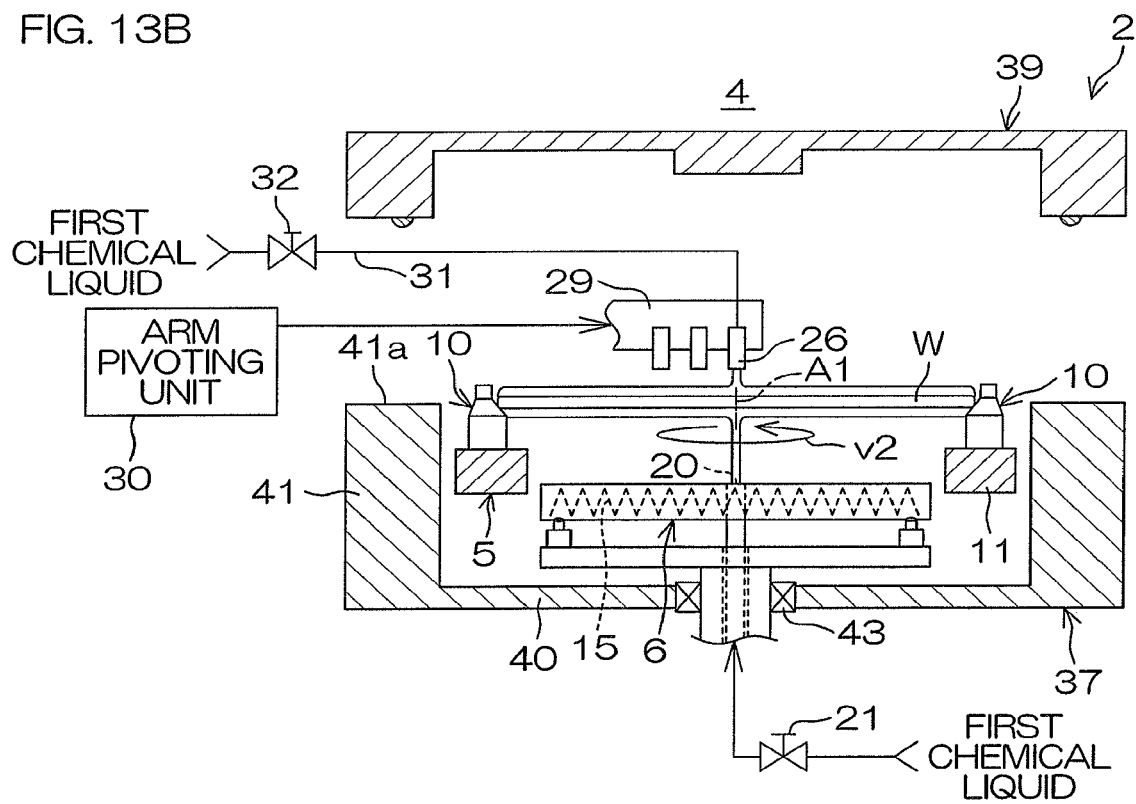
Figure 14A:
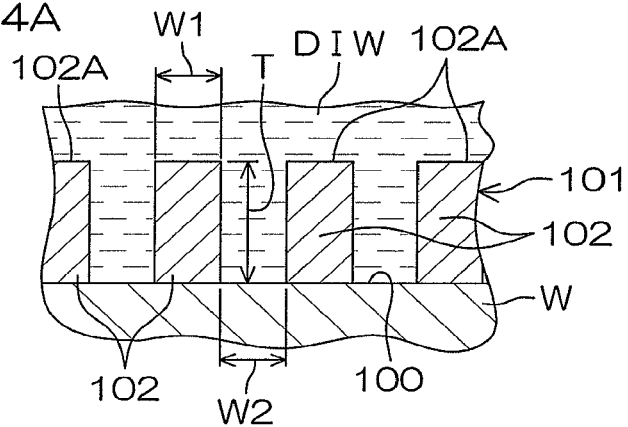
FIGS. 14A to 14D are schematic sectional views for explaining states of the upper surface of the substrate observed in the first exemplary process.

More specifically, as shown in FIG. 13B, the controller 3 controls the arm pivoting unit 30 to pivot the arm 29 from the home position to move the first chemical liquid nozzle 26 from the retracted position to the position above the substrate W. Thus, the first chemical liquid nozzle 26 is located at the treatment position (on the rotation axis A1 of the substrate W above the substrate W). After the first chemical liquid nozzle 26 is located at the treatment position, the controller 3 opens the first chemical liquid valve 32 with the second chemical liquid valve 34 and the rinse liquid valve 36 being closed. Thus, the first chemical liquid is spouted from the spout of the first chemical liquid nozzle 26. Further, the controller 3 opens the lower first chemical liquid valve 21 with the lower second chemical liquid valve 22 and the lower rinse liquid valve 23 being closed. Thus, the first chemical liquid is spouted upward from the lower outlet port 20.

The first chemical liquid supplied to the center portion of the upper surface of the substrate W receives a centrifugal force generated by the rotation of the substrate W to flow toward the peripheral portion of the substrate W on the upper surface of the substrate W. On the other hand, the first chemical liquid supplied to the center portion of the lower surface of the substrate W also receives the centrifugal force generated by the rotation of the substrate W to flow toward the peripheral portion of the substrate W on the lower surface of the substrate W. Thus, the first chemical liquid is supplied to the entire upper surface and the entire lower surface of the substrate W, whereby the entire upper and lower surfaces of the substrate W are treated with the first chemical liquid. The first chemical liquid supplied to the upper and lower surfaces of the substrate W is scattered from the peripheral portion of the substrate W laterally of the substrate W.

The first chemical liquid scattered from the peripheral portions of the upper and lower surfaces of the substrate W is received by an inner wall of the capture cup described above to be sent to the external waste liquid facility (not shown) through the waste liquid passage (not shown), and treated in the waste liquid facility. The scattered liquid may be sent to a recovery facility, rather than to the waste liquid facility, for recycling.

After a lapse of a predetermined period from the start of the spouting of the first chemical liquid, the controller 3 closes the first chemical liquid valve 32 and the lower first chemical liquid valve 21 to stop spouting the first chemical liquid from the first chemical liquid nozzle 26 and the lower outlet port 20.

Subsequently, a first rinsing step (Step S3 in FIG. 12) is performed to remove the first chemical liquid from the substrate W.

Figure 13C:
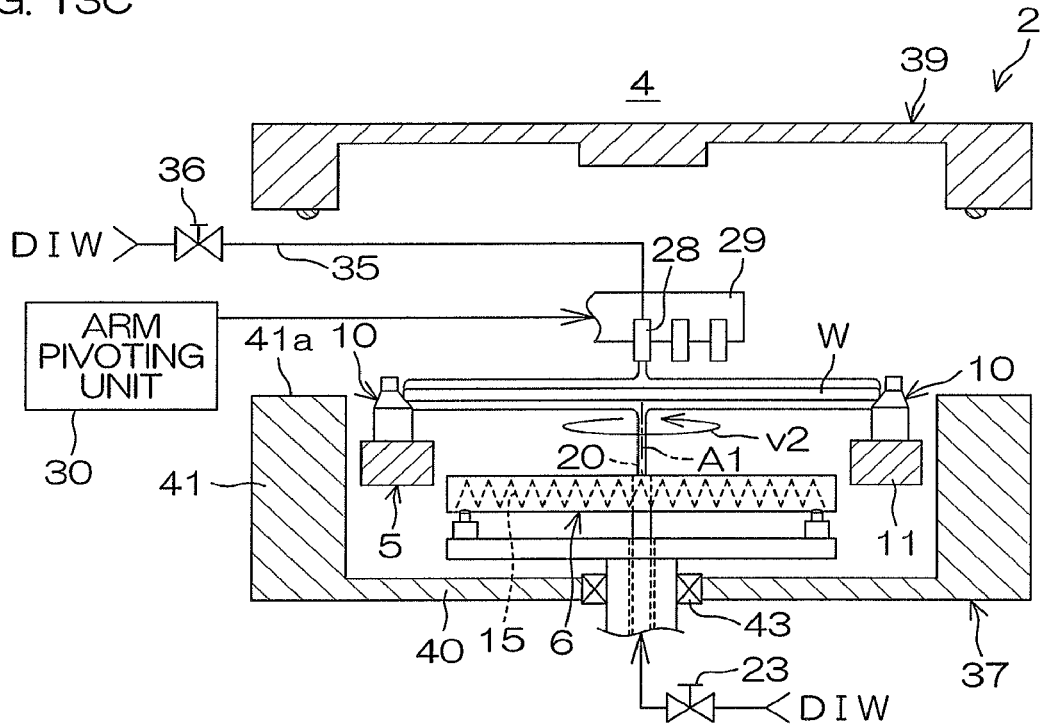

More specifically, as shown in FIG. 13C, the controller 3 controls the arm pivoting unit 30 to pivot the arm 29 to locate the rinse liquid nozzle 28 at the treatment position. After the rinse liquid nozzle 28 is located at the treatment position, the controller 3 opens the rinse liquid valve 36 with the first chemical liquid valve 32 and the second chemical liquid valve 34 being closed. Thus, the rinse liquid is spouted from the spout of the rinse liquid nozzle 28. Further, the controller 3 opens the lower rinse liquid valve 23 with the lower first chemical liquid valve 21 and the lower second chemical liquid valve 22 being closed. Thus, the rinse liquid is spouted upward from the lower outlet port 20.

The rinse liquid supplied to the center portion of the upper surface of the substrate W receives the centrifugal force generated by the rotation of the substrate W to flow toward the peripheral portion of the substrate W on the upper surface of the substrate W. On the other hand, the rinse liquid supplied to the center portion of the lower surface of the substrate W also receives the centrifugal force generated by the rotation of the substrate W to flow toward the peripheral portion of the substrate W on the lower surface of the substrate W. Thus, the rinse liquid is supplied to the entire upper surface and the entire lower surface of the substrate W to rinse away the first chemical liquid from the upper and lower surfaces of the substrate W. The rinse liquid supplied to the upper and lower surfaces of the substrate W is scattered from the peripheral portion of the substrate W laterally of the substrate W.

The rinse liquid scattered from the peripheral portions of the upper and lower surfaces of the substrate W is received by an inner wall of the peripheral wall 41 of the lower cup portion 37, and flows on the inner wall to be retained in the bottom of the lower cup portion 37. The rinse liquid retained in the bottom of the lower cup portion 37 is sent to the external waste liquid facility (not shown) through the waste liquid passage (not shown), and treated in the waste liquid facility.

After a lapse of a predetermined period from the start of the spouting of the rinse liquid, the controller 3 closes the rinse liquid valve 36 and the lower rinse liquid valve 23 to stop spouting the rinse liquid from the rinse liquid nozzle 28 and the lower outlet port 20.

In turn, a second chemical liquid step (Step S4 in FIG. 12) is performed to supply the second chemical liquid to the substrate W.

Figure 13D:
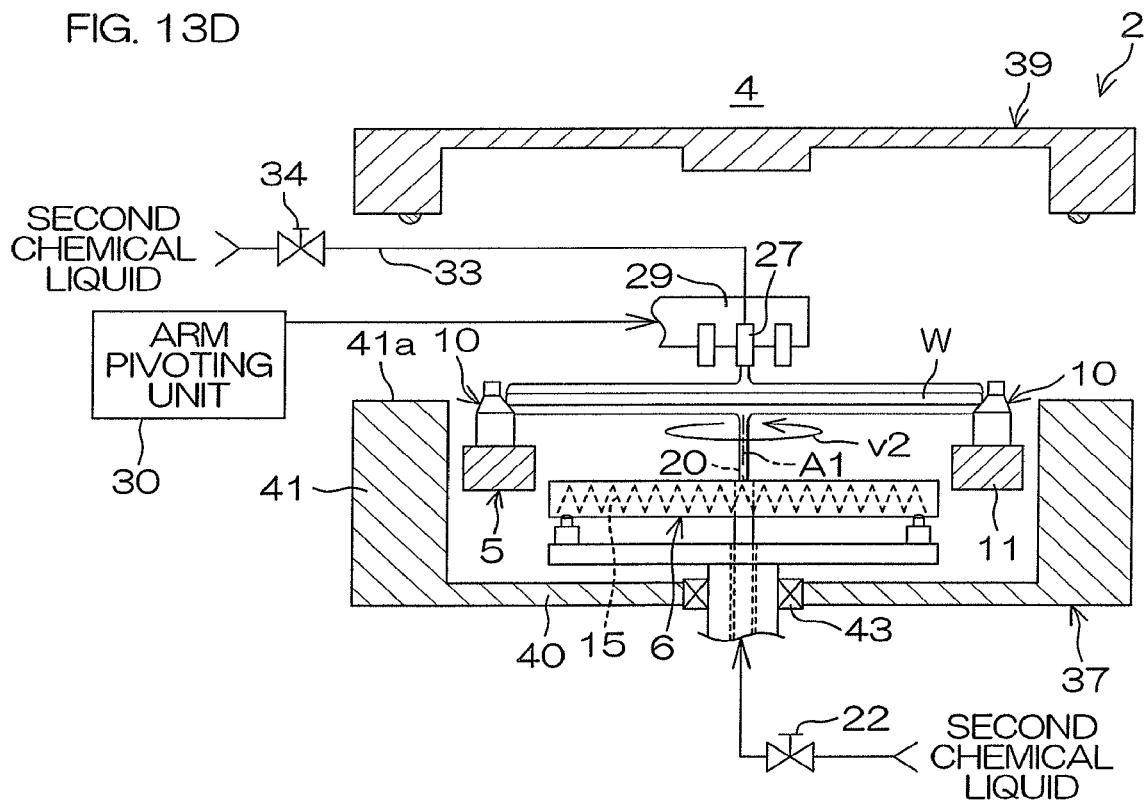

More specifically, as shown in FIG. 13D, the controller 3 controls the arm pivoting unit 30 to pivot the arm 29 to locate the second chemical liquid nozzle 27 at the treatment position. After the second chemical liquid nozzle 27 is located at the treatment position, the controller 3 opens the second chemical liquid valve 34 with the first chemical liquid valve 32 and the rinse liquid valve 36 being closed. Thus, the second chemical liquid is spouted from the spout of the second chemical liquid nozzle 27. Further, the controller 3 opens the lower second chemical liquid valve 22 with the lower first chemical liquid valve 21 and the lower rinse liquid valve 23 being closed. Thus, the second chemical liquid is spouted upward from the lower outlet port 20.

The second chemical liquid supplied to the center portion of the upper surface of the substrate W receives the centrifugal force generated by the rotation of the substrate W to flow toward the peripheral portion of the substrate W on the upper surface of the substrate W. On the other hand, the second chemical liquid supplied to the center portion of the lower surface of the substrate W also receives the centrifugal force generated by the rotation of the substrate W to flow toward the peripheral portion of the substrate W on the lower surface of the substrate W. Thus, the second chemical liquid is supplied to the entire upper surface and the entire lower surface of the substrate W, whereby the entire upper and lower surfaces of the substrate W are treated with the second chemical liquid. The second chemical liquid supplied to the upper and lower surfaces of the substrate W is scattered from the peripheral portion of the substrate W laterally of the substrate W.

The second chemical liquid scattered from the peripheral portions of the upper and lower surfaces of the substrate W is received by the inner wall of the peripheral wall 41 of the lower cup portion 37, and flows on the inner wall to be retained in the bottom of the lower cup portion 37. The second chemical liquid retained in the bottom of the lower cup portion 37 is sent to the external waste liquid facility (not shown) through the waste liquid passage (not shown), and treated in the waste liquid facility. The scattered liquid may be sent to a recovery facility, rather than to the waste liquid facility, for recycling.

After a lapse of a predetermined period from the start of the spouting of the second chemical liquid, the controller 3 closes the second chemical liquid valve 34 and the lower second chemical liquid valve 22 to stop spouting the second chemical liquid from the second chemical liquid nozzle 27 and the lower outlet port 20.

Subsequently, a second rinsing step (Step S5 in FIG. 12, see FIG. 13C again) is performed to remove the second chemical liquid from the substrate W.

More specifically, the controller 3 controls the arm pivoting unit 30 to pivot the arm 29 to locate the rinse liquid nozzle 28 at the treatment position. After the rinse liquid nozzle 28 is located at the treatment position, the controller 3 opens the rinse liquid valve 36 with the first chemical liquid valve 32 and the second chemical liquid valve 34 being closed. Thus, the rinse liquid is spouted from the spout of the rinse liquid nozzle 28. Further, the controller 3 opens the lower rinse liquid valve 23 with the lower first chemical liquid valve 21 and the lower second chemical liquid valve 22 being closed. Thus, the rinse liquid is spouted upward from the lower outlet port 20.

The rinse liquid supplied to the center portion of the upper surface of the substrate W receives the centrifugal force generated by the rotation of the substrate W to flow toward the peripheral portion of the substrate W on the upper surface of the substrate W. On the other hand, the rinse liquid supplied to the center portion of the lower surface of the substrate W also receives the centrifugal force generated by the rotation of the substrate W to flow toward the peripheral portion of the substrate W on the lower surface of the substrate W. Thus, the rinse liquid is supplied to the entire upper surface and the entire lower surface of the substrate W to rinse away the second chemical liquid from the upper and lower surfaces of the substrate W. The rinse liquid supplied to the upper and lower surfaces of the substrate W is scattered from the peripheral portion of the substrate W laterally of the substrate W.

After a lapse of a predetermined period from the start of the spouting of the rinse liquid, the controller 3 closes the rinse liquid valve 36 and the lower rinse liquid valve 23 to stop spouting the rinse liquid from the rinse liquid nozzle 28 and the lower outlet port 20. Subsequently, the first chemical liquid step (Step S6 in FIG. 12, see FIG. 13B again) is performed again to supply the first chemical liquid to the substrate W.

More specifically, the controller 3 controls the arm pivoting unit 30 to pivot the arm 29 to locate the first chemical liquid nozzle 26 at the treatment position. After the first chemical liquid nozzle 26 is located at the treatment position, the controller 3 opens the first chemical liquid valve 32 with the second chemical liquid valve 34 and the rinse liquid valve 36 being closed. Thus, the first chemical liquid is spouted from the spout of the first chemical liquid nozzle 26. Further, the controller 3 opens the lower first chemical liquid valve 21 with the lower second chemical liquid valve 22 and the lower rinse liquid valve 23 being closed. Thus, the first chemical liquid is spouted upward from the lower outlet port 20.

The first chemical liquid supplied to the center portion of the upper surface of the substrate W receives the centrifugal force generated by the rotation of the substrate W to flow toward the peripheral portion of the substrate W on the upper surface of the substrate W. On the other hand, the first chemical liquid supplied to the center portion of the lower surface of the substrate W also receives the centrifugal force generated by the rotation of the substrate W to flow toward the peripheral portion of the substrate W on the lower surface of the substrate W. Thus, the first chemical liquid is supplied to the entire upper surface and the entire lower surface of the substrate W, whereby the entire upper and lower surfaces of the substrate W are treated with the first chemical liquid. The first chemical liquid supplied to the upper and lower surfaces of the substrate W is scattered from the peripheral portion of the substrate W laterally of the substrate W.

After a lapse of a predetermined period from the start of the spouting of the first chemical liquid, the controller 3 closes the first chemical liquid valve 32 and the lower first chemical liquid valve 21 to stop spouting the first chemical liquid from the first chemical liquid nozzle 26 and the lower outlet port 20. Subsequently, a third rinsing step (Step S7 in FIG. 12, see FIG. 13C again) is performed to remove the first chemical liquid from the substrate W.

More specifically, the controller 3 controls the arm pivoting unit 30 to pivot the arm 29 to locate the rinse liquid nozzle 28 at the treatment position. After the rinse liquid nozzle 28 is located at the treatment position, the controller 3 opens the rinse liquid valve 36 with the first chemical liquid valve 32 and the second chemical liquid valve 34 being closed. Thus, the rinse liquid is spouted from the spout of the rinse liquid nozzle 28. Further, the controller 3 opens the lower rinse liquid valve 23 with the lower first chemical liquid valve 21 and the lower second chemical liquid valve 22 being closed. Thus, the rinse liquid is spouted upward from the lower outlet port 20.

The rinse liquid supplied to the center portion of the upper surface of the substrate W receives the centrifugal force generated by the rotation of the substrate W to flow toward the peripheral portion of the substrate W on the upper surface of the substrate W. On the other hand, the rinse liquid supplied to the center portion of the lower surface of the substrate W also receives the centrifugal force generated by the rotation of the substrate W to flow toward the peripheral portion of the substrate W on the lower surface of the substrate W. Thus, the rinse liquid is supplied to the entire upper surface and the entire lower surface of the substrate W to rinse away the first chemical liquid from the upper and lower surfaces of the substrate W. The rinse liquid supplied to the upper and lower surfaces of the substrate W is scattered from the peripheral portion of the substrate W laterally of the substrate W.

After a lapse of a predetermined period from the start of the spouting of the rinse liquid, the controller 3 closes the rinse liquid valve 36 and the lower rinse liquid valve 23 to stop spouting the rinse liquid from the rinse liquid nozzle 28 and the lower outlet port 20, and controls the arm pivoting unit 30 to move the arm 29 back to its home position. Thus, the first chemical liquid nozzle 26, the second chemical liquid nozzle 27 and the rinse liquid nozzle 28 are moved back to the retracted position.

Subsequently, the controller 3 controls the lid lift unit 54 to move down the lid member 39 to the lid closing position. The opening 38 of the lower cup portion 37 is closed by the lid member 39 thus moved down to the lid closing position. When the lid member 39 and the lower cup portion 37 are connected to each other by a lock member (not shown) in this state, the seal ring 53 provided on the peripheral portion 39c of the lower surface of the lid member 39 abuts against the upper end surface 41a of the lower cup portion 37 along the entire circumference, whereby the gap between the lower cup portion 37 and the lid member 39 is sealed. Thus, an inner space defined by the lower cup portion 37 and the lid member 39 is sealed. In this state, the rinse liquid outlet port 47, the organic solvent outlet port 49 and the nitrogen gas outlet port 51 are opposed to the upper surface of the substrate W.

Then, a final rinsing step (Step S8 in FIG. 12) is performed on the substrate W.

Figure 13E:
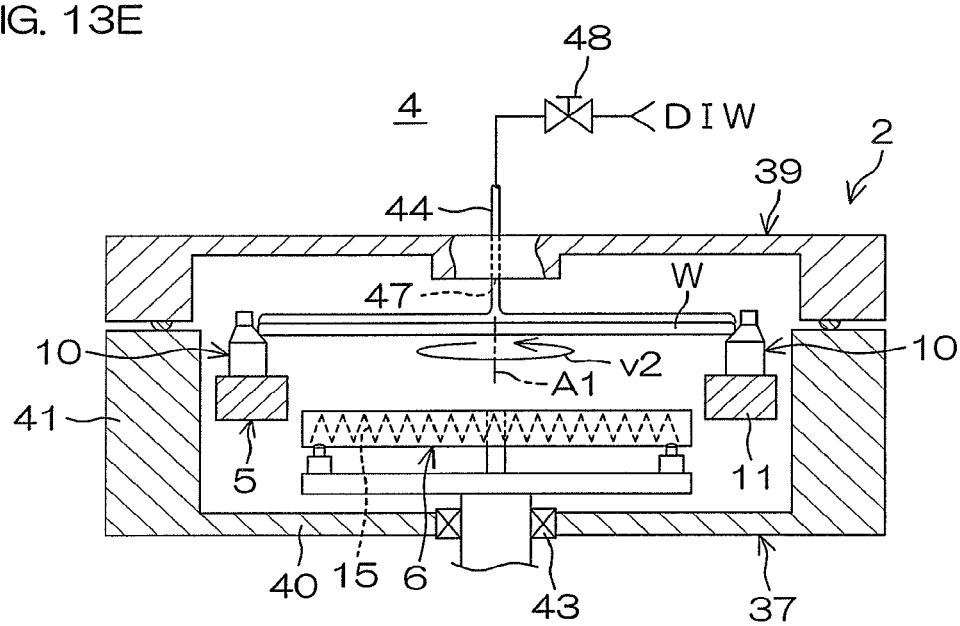

More specifically, as shown in FIG. 13E, the controller 3 opens the upper rinse liquid valve 48 to spout the rinse liquid from the rinse liquid outlet port 47 of the upper rinse liquid line 44. The rinse liquid spouted from the rinse liquid outlet port 47 is applied to the center portion of the upper surface of the substrate W.

The rinse liquid supplied to the center portion of the upper surface of the substrate W receives the centrifugal force generated by the rotation of the substrate W to flow toward the peripheral portion of the substrate W on the upper surface of the substrate W. Thus, the rinse liquid is supplied to the entire upper surface of the substrate W, whereby the upper surface of the substrate W is rinsed with the rinse liquid. In the final rinsing step (S8), the rinse liquid is distributed to bottom portions of gaps of the minute pattern 101 formed on the upper surface 100 of the substrate W (to portions of the gaps that are very close to the upper surface 100 of the substrate W itself) as shown in FIG. 14A.

The rinse liquid scattered from the peripheral portion of the substrate W is received by the inner wall of the peripheral wall 41 of the lower cup portion 37, and flows on the inner wall to be retained in the bottom of the lower cup portion 37. The rinse liquid retained in the bottom of the lower cup portion 37 is sent to the external waste liquid facility (not shown) through the waste liquid passage (not shown), and treated in the waste liquid facility.

After a lapse of a predetermined period from the start of the spouting of the rinse liquid, the controller 3 closes the upper rinse liquid valve 48 to stop spouting the rinse liquid from the rinse liquid outlet port 47.

Subsequently, an organic solvent replacing step (Step S9 in FIG. 12) is performed to replace the rinse liquid with the liquid IPA on the upper surface of the substrate W by supplying the liquid IPA to the upper surface of the substrate W.

After the completion of the final rinsing step (S8), the controller 3 accelerates the rotation of the substrate W from the liquid treatment rotation speed v3 (see FIG. 17) to a higher rotation speed v4 (see FIG. 17, e.g., 800 rpm).

Figure 13F:
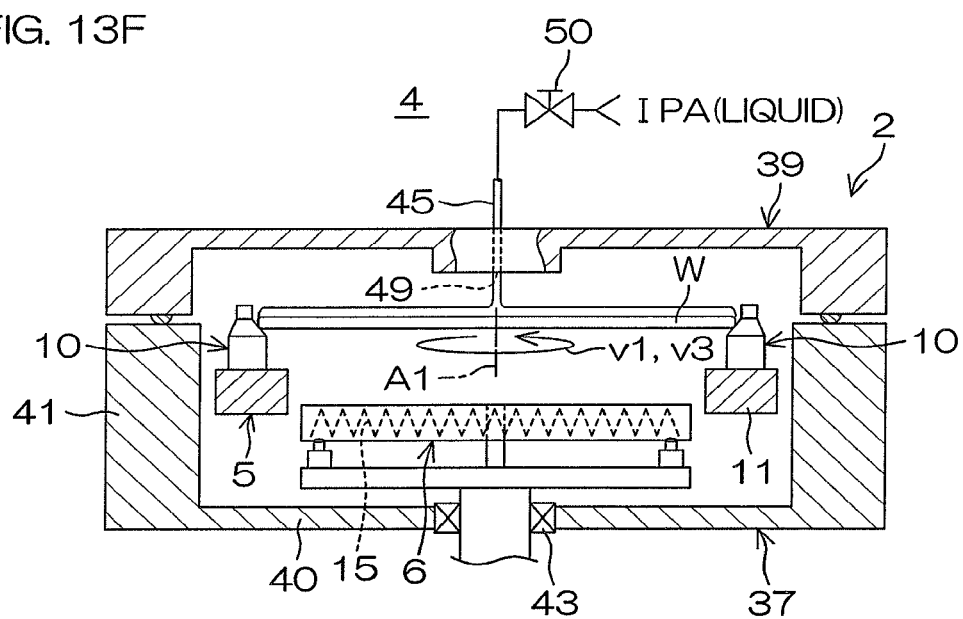

When the rotation speed of the substrate W reaches the higher rotation speed v4, as shown in FIG. 13F, the controller 3 opens the organic solvent valve 50 to spout the liquid IPA in the form of continuous stream from the organic solvent outlet port 49 of the upper organic solvent line 45. The IPA spouted from the organic solvent outlet port 49 is in a liquid form at an ordinary temperature, i.e., has a liquid temperature lower than the boiling point of the IPA (82.4° C.). The liquid IPA spouted from the organic solvent outlet port 49 is applied to the center portion of the upper surface of the substrate W. The organic solvent replacing step (S9) is started by the start of the spouting of the IPA.

The liquid IPA supplied to the center portion of the upper surface of the substrate W receives the centrifugal force generated by the rotation of the substrate W, and flows toward the peripheral portion of the substrate W on the upper surface of the substrate W. Therefore, the liquid IPA supplied to the center portion of the upper surface of the substrate W can spread toward the peripheral portion to be thereby distributed to the entire upper surface of the substrate W. At this time, the hot plate 6 is located at the lower position, so that the heat from the hot plate 6 is not sufficiently transferred to the substrate W. Therefore, the upper surface of the substrate W is maintained, for example, at an ordinary temperature (e.g., 25° C.), so that the IPA flows on the upper surface of the substrate W while being maintained at the ordinary temperature.

In the organic solvent replacing step (S9), the controller 3 performs a higher speed rotation step (Step S91, see FIG. 17) to rotate the substrate W at the higher rotation speed v4, and then performs a puddling step (Step S92, see FIG. 17) to rotate the substrate W at a puddling speed v1 (a lower speed closer to zero in a range lower than 50 rpm, e.g., about 20 rpm).

More specifically, the controller 3 rotates the substrate W at the higher rotation speed v4 for a predetermined higher speed rotation period t1 (e.g., about 15 seconds) after the start of the organic solvent replacing step (S9) (higher speed rotation step (S91)). After a lapse of the higher speed rotation period t1, the controller 3 reduces the rotation speed of the substrate W from the higher rotation speed v4 to the puddling speed v1. As the rotation speed of the substrate W is reduced, the centrifugal force acting on the liquid IPA present on the substrate W is reduced. Therefore, the liquid IPA is not expelled from the peripheral portion of the substrate W but retained on the upper surface of the substrate W. As a result, a liquid film 111 of the liquid IPA is retained in a puddle-like state on the upper surface of the substrate W (puddling step (S92)). Since the liquid IPA is distributed over the entire upper surface of the substrate W, the IPA liquid film 111 covers the entire upper surface of the substrate W. The IPA liquid film 111 has a predetermined thickness (e.g., about 1 mm).

Figure 14B:
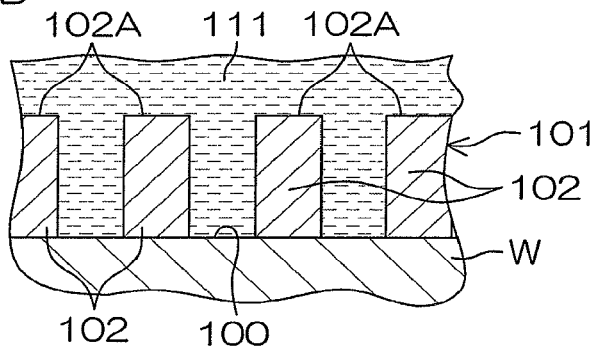
Figure 15:
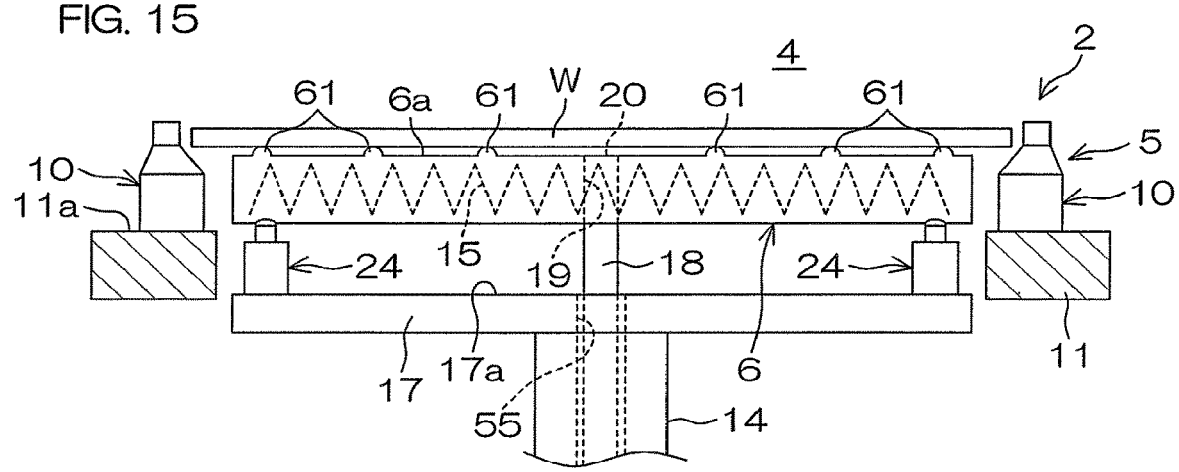
FIG. 15 is a vertical sectional view of the substrate holding and rotating unit and the hot plate as seen horizontally in a substrate temperature increasing step.

Since the IPA supplied to the upper surface of the substrate W is in a liquid form, the rinse liquid present in the gaps of the minute pattern 101 can be properly replaced with the IPA as shown in FIG. 14B. The IPA liquid film 111 covers the entire upper surface of the substrate W, so that the rinse liquid can be properly replaced with the liquid IPA on the entire upper surface of the substrate W. After a lapse of a puddling period t2 (e.g., about 15 seconds), the controller 3 controls the ring rotating unit 13 to stop the rotation of the substrate W.

In the puddling step (S92), the substrate W is rotated at the puddling speed v1 which is a lower rotation speed by way of example. Alternatively, the rotation of the substrate W may be stopped (the rotation speed may be reduced to zero) in the puddling step (S92). In this case, the centrifugal force acting on the liquid IPA present on the substrate W becomes zero in the puddling step (S92), so that the liquid IPA is not expelled from the peripheral portion of the substrate W but retained on the upper surface of the substrate W. Thus, the puddle-like IPA liquid film 111 is retained on the upper surface of the substrate W.

Subsequently, a substrate temperature increasing step (Step S10 in FIG. 12) is performed.

Figure 13G:
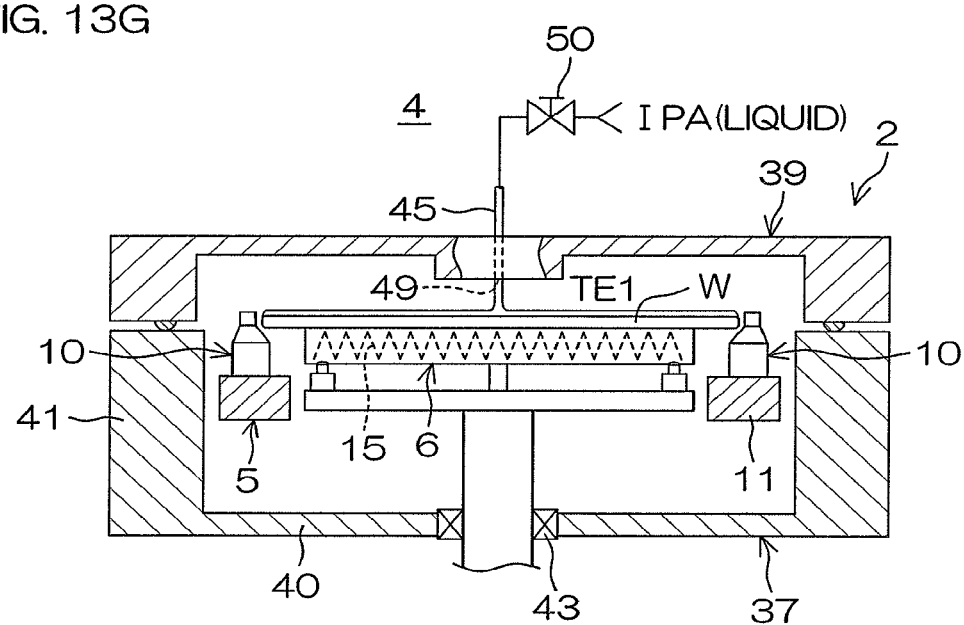
Figure 13H:
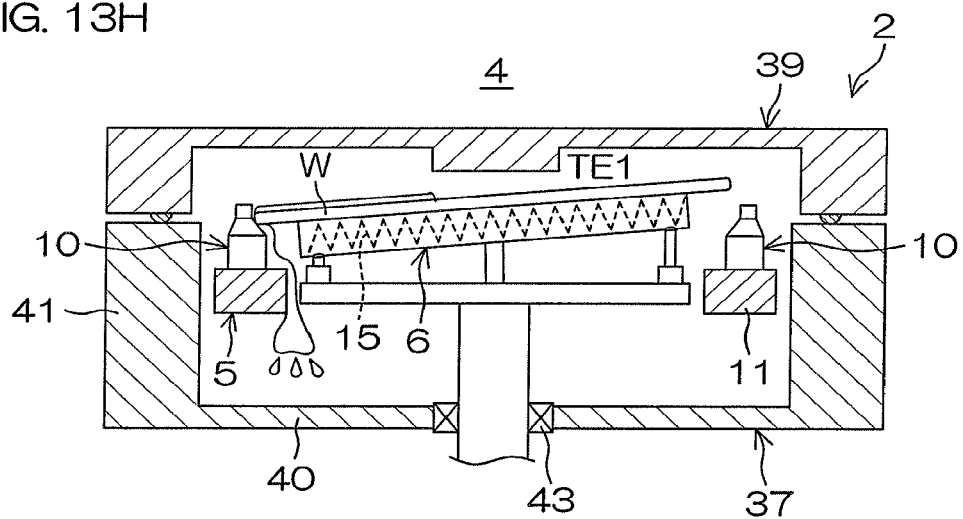

More specifically, the controller 3 controls the plate lift unit 16 to move up the hot plate 6 from the lower position to the upper position. When the hot plate 6 is moved up to the same height as the support ring 11, the multiple embosses 61 on the substrate opposing surface 6a of the hot plate 6 are brought into abutment against the lower surface of the substrate W. When the hot plate 6 is thereafter further moved up, the substrate W supported from below by the plural fixed pins 10 is disengaged from these fixed pins 10 to be transferred to the hot plate 6. The substrate W transferred to the hot plate 6 is supported from below by the multiple embosses 61. A state of the hot plate 6 located at the upper position is shown in FIGS. 13G and 15.

Since the heater 15 is constantly energized, the hot plate 6 (substrate opposing surface 6a) is kept in the heat generating state. With the substrate W placed on the hot plate 6, the heat from the substrate opposing surface 6a is applied to the lower surface of the substrate W by the heat radiation, the heat conduction through the fluid present in the space defined between the substrate opposing surface 6a and the substrate W, and the heat conduction via the multiple embosses 61. Thus, the lower surface of the substrate W is heated. The amount of the heat to be applied to the unit area of the substrate W is substantially uniform throughout the substrate W.

In the substrate temperature increasing step (S10), the temperature of the upper surface of the substrate W is increased to a predetermined liquid film levitation temperature (first temperature) TE1 by heating the substrate W with the use of the hot plate 6. The liquid film levitation temperature TE1 is predetermined so as to be higher by 40° C. to 120° C. than the boiling point of the IPA (82.4° C.). As will be described later, the IPA liquid film 111 is levitated in the substrate temperature increasing step (S10), and the liquid film levitation temperature TE1 is a temperature such that the levitated IPA liquid film 111 is prevented from boiling.

After the temperature of the upper surface of the substrate W reaches the liquid film levitation temperature TE1, the temperature of the upper surface of the substrate W (the temperature of the upper surface of the minute pattern 101 (see FIG. 14C and the like), more specifically, the temperatures of the upper end surfaces 102A of the respective structures 102) is maintained at the liquid film levitation temperature TE1. The entire upper surface of the substrate W is maintained at the liquid film levitation temperature TE1. At this time, the amount of the heat generated per unit period by the heater 15 is set so that the upper surface of the substrate W placed on the hot plate 6 is maintained at the liquid film levitation temperature TE1 by the heating with the hot plate 6.

Shortly after the temperature of the upper surface of the substrate W reaches the liquid film levitation temperature TE1, a part of the IPA liquid film 111 on the upper surface of the substrate W evaporates, whereby the gaps of the minute pattern 101 are filled with the resulting IPA vapor, and an IPA vapor film 112 is formed above the upper surface of the substrate W (above the upper end surfaces 102A of the respective structures 102). Thus, the IPA liquid film 111 is levitated from the upper surface of the substrate W (from the upper end surfaces 102A of the respective structures 102) (see FIG. 14C). Further, the gaps of the minute pattern 101 are filled with the IPA vapor.

When the substrate W is dried with the gaps of the minute pattern 101 filled with the liquid IPA, for example, attractive forces occur between adjacent structures 102, so that the minute pattern 101 is liable to be collapsed. In the state shown in FIG. 14C, in contrast, the gaps of the minute pattern 101 are filled with the IPA vapor. Therefore, only a very small surface tension occurs between the adjacent structures 102. As a result, the collapse of the minute pattern 101 can be suppressed or prevented which may otherwise occur due to the surface tension.

Figure 14C:
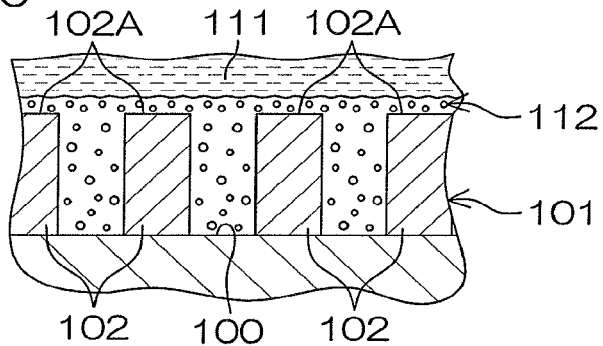
Figure 14D:
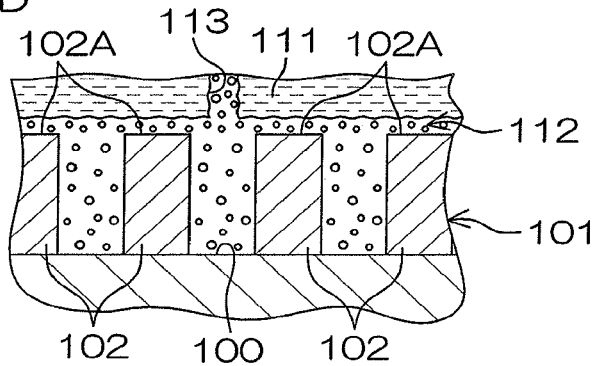

In the state shown in FIG. 14C, the IPA liquid film 111 is levitated from the upper surface of the substrate W (from the upper end surfaces 102A of the respective structures 102), so that the magnitude of a frictional force occurring between the upper surface of the substrate W and the IPA liquid film 111 is generally zero.

The period of the substrate temperature increasing step (S10) (a period after the hot plate 6 starts retaining the substrate W) is set so as to be sufficient to levitate the IPA liquid film 111 above the entire upper surface of the substrate W present on the hot plate 6 and to evaporate the liquid IPA in the gaps of the minute pattern 101. In the first exemplary process, the period of the substrate temperature increasing step (S10) is, for example, 1 to 2 minutes.

Where the minute pattern 101 on the upper surface 100 of the substrate W has a higher aspect ratio, the area of contact between the liquid IPA and the structures 102 of the minute pattern 101 is increased, requiring a greater heat amount for evaporating the liquid IPA in the gaps between the structures 102. In order to evaporate the liquid IPA in the gaps between the structures 102, in this case, it is desirable to properly control the liquid film levitation temperature TE1 and the substrate temperature increasing period according to the aspect ratio of the minute pattern 101 on the substrate W to be treated.

The IPA liquid film 111 levitated above the substrate W is liable to be slit or fragmented as indicated by 113 (hereinafter referred to as "slitting 113"). As the result of the slitting 113, there is a liquid-solid interface between the IPA liquid droplets and the substrate W around the slitting 113, so that the collapse of the pattern is liable to occur due to the surface tension during drying. A portion of the substrate W on which the slitting 113 occurs is liable to suffer from a water mark or other defects after the drying. Therefore, the slitting 113 of the levitated IPA liquid film 111 should be prevented or suppressed in the substrate temperature increasing step (S10).

The following two factors are the cause of the slitting 113 of the levitated IPA liquid film 111.

The first causal factor is the generation of a great amount of the IPA vapor and/or the boiling of the IPA liquid film 111 due to the heating of the substrate W for a longer period. If the IPA vapor is generated in a great amount and/or the IPA liquid film 111 boils, the IPA vapor film 112 breaks through the IPA liquid film 111 to above the IPA liquid film 111. As a result, the IPA liquid film 111 suffers from the slitting 113.

To cope with the first causal factor, the liquid film levitation temperature TE1 in the substrate temperature increasing step (S10) and the period of the substrate temperature increasing step (S10) are determined so as to prevent the slitting 113 in the first exemplary process. In addition, the thickness of the levitated IPA liquid film 111 is maintained so as to prevent the slitting during the entire period of the substrate temperature increasing step (S10) by continuously supplying the liquid IPA in the substrate temperature increasing step (S10).

The second causal factor of the slitting 113 is the splitting of the IPA liquid film 111 which is caused when the IPA liquid film 111 receives the centrifugal force generated by the rotation of the substrate W. To cope with the second causal factor, the rotation of the substrate W is stopped in the substrate temperature increasing step (S10) of the first exemplary process. This prevents the splitting of the IPA liquid film which may otherwise occur due to the centrifugal force, thereby preventing the slitting 113.

After the substrate temperature increasing step (S10), an organic solvent removing step (S11 in FIG. 12) is performed to remove the IPA liquid film 111 in the form of liquid mass above the vapor film 112.

After a lapse of a predetermined period from the transfer of the substrate W to the hot plate 6, more specifically, the controller 3 controls the extension units 24 to shift the hot plate 6 from the horizontal attitude to the inclined attitude as shown in FIGS. 13G and 16.

The organic solvent removing step will be detailed with reference to FIG. 16. While the predetermined one 224 of the three extension units 24 is kept unchanged, the other two extension units 225 (only one extension unit 225 is shown in FIG. 16) are elongated. These two extension units 225 have the same elongation amount. Thus, the hot plate 6 can be shifted to the inclined attitude. With the hot plate 6 in the inclined attitude, the substrate opposing surface 6a is inclined with respect to the horizontal plane. At this time, the inclination angle is, for example, about 1 degree. That is, the substrate opposing surface 6a is inclined, for example, by about 1 degree with respect to the horizontal plane with the hot plate 6 kept in the inclined attitude. Thus, the upper surface of the substrate W supported by the hot plate 6 is also inclined, for example, by about 1 degree with respect to the horizontal plane. At this time, a circumferential portion of the hot plate 6 present intermediate between the two extension units 225 is located at the highest position, and a circumferential portion of the hot plate 6 adjacent to the extension unit 224 is located at the lowest position.

With the substrate W kept in the inclined attitude, as shown in FIG. 16, the first upper shaft portion 72 and the tapered surface 73 (see FIG. 6) of one of the fixed pins 10 (fixed pin 210) located at the same circumferential position as the shortest extension unit 224 with respect to the circumference of the hot plate 6 (closest to the shortest extension unit 224) abut against the lowest peripheral portion of the inclined substrate W, thereby preventing the substrate W from being moved along the substrate opposing surface 6a.

The substrate W is supported on the hot plate 6 by the frictional force occurring between the multiple embosses 61 and the lower surface of the substrate W. With the substrate W and the hot plate 6 kept in the horizontal attitude, the substrate W is not moved but kept still by the frictional force. With the substrate W kept in the inclined state, on the other hand, the weight of the substrate W acts on the substrate W. If a force acting on the substrate W along the substrate opposing surface 6a due to the weight of the substrate W becomes greater than the frictional force, there is a possibility that the substrate W is moved along the substrate opposing surface 6a. However, the fixed pin 210 (the fixed pin 10 located at the same circumferential position as the extension unit 224 with respect to the circumference of the hot plate 6) abuts against the lowest peripheral portion of the inclined substrate W, thereby preventing the substrate W from being moved along the hot plate 6 to slip down from the hot plate 6. This makes it possible to maintain both the substrate W and the hot plate 6 in the inclined attitude, while reliably preventing the substrate W from slipping down from the hot plate 6.

Further, the slippage of the substrate W from the hot plate 6 is prevented by the fixed pin 210 which serves to support the substrate W. Therefore, the number of components and hence the costs can be reduced as compared with a case in which a slippage preventing member is provided separately from the fixed pin 210.

At the end of the substrate temperature increasing step (S10), as described above, the magnitude of the frictional force occurring between the upper surface of the substrate W and the IPA liquid film 111 is generally zero. Therefore, the IPA liquid film 111 is easily moved along the upper surface of the substrate W. In the organic solvent removing step (S11), the upper surface of the substrate W is inclined with respect to the horizontal plane, so that the IPA liquid film 111 is moved toward the lowest peripheral portion of the inclined substrate W along the upper surface of the substrate W by gravity. The IPA liquid film 111 is moved in the form of liquid mass (i.e., without disintegration into a multiplicity of liquid droplets) to be thereby removed from above the substrate W.

After the IPA liquid film 111 is completely removed from above the substrate W, the controller 3 controls the extension units 24 to shift the hot plate 6 back into the horizontal attitude from the inclined attitude. The controller 3 controls the plate lift unit 16 to move down the hot plate 6 from the upper position to the lower position. During the downward movement of the hot plate 6 from the upper position to the lower position, the lower surface peripheral portion of the substrate W is brought into abutment against the tapered surfaces 73 of the fixed pins 10. Thereafter, the hot plate 6 is further moved down, whereby the substrate W is disengaged from the hot plate 6 to be supported from below by the plural fixed pins 10 of the substrate holding and rotating unit 5. The movable pins 12 are kept in the unclamping state, so that the substrate W is only supported from below by the fixed pins 10 but is not clamped by the fixed pins 10, the movable pins 12 and the like.

The controller 3 drives the lock member (not shown) to disengage the lid member 39 and the lower cup portion 37 from each other. Then, as shown in FIG. 13I, the controller 3 controls the lid lift unit 54 to move up the lid member 39 to the opening position.

After the hot plate 6 is moved down to the lower position, the distance between the hot plate 6 and the substrate W held by the substrate holding and rotating unit 5 is increased as compared with the distance observed when the hot plate 6 is located at the upper position. Therefore, the heat from the hot plate 6 does not sufficiently reach the substrate W (by the heat radiation, the heat conduction through the fluid present in the space defined between the substrate opposing surface 6a and the substrate W, and the heat conduction via the multiple embosses 61). Thus, the heating of the substrate W by the hot plate 6 ends, whereby the temperature of the substrate W is reduced substantially to the ordinary temperature.

In this manner, the chemical liquid treatment of the single substrate W is completed, and the substrate transfer robot CR (see FIG. 1) unloads the treated substrate W from the chamber 4 (Step S12 in FIG. 12).

As described above, the rinse liquid present in the gaps of the minute pattern 101 is replaced with the liquid IPA by supplying the liquid IPA to the upper surface of the substrate to form the IPA liquid film 111 covering the upper surface of the substrate W. Since the entire upper surface of the substrate W is covered with the IPA liquid film 111, the rinse liquid present in the gaps of the minute pattern 101 can be properly replaced with the liquid IPA on the entire upper surface of the substrate W. After the formation of the IPA liquid film 111, the temperature of the upper surface of the substrate W is allowed to reach (increased to) the liquid film levitation temperature TE1. Thus, the IPA vapor film 112 is formed between the IPA liquid film 111 and the upper surface of the substrate W over the entire upper surface of the substrate W and, at the same time, the IPA liquid film 111 is levitated above the IPA vapor film 112. In this state, the magnitude of the frictional force occurring between the upper surface of the substrate W and the IPA liquid film 111 is generally zero. Therefore, the IPA liquid film 111 is easily moved along the upper surface of the substrate W.

In the organic solvent removing step (S11), the upper surface of the substrate W is inclined with respect to the horizontal plane by shifting the substrate W and the hot plate 6 into the inclined attitude while maintaining the substrate W and the hot plate 6 in a predetermined attitude relationship. Thus, the levitated IPA liquid film 111 is moved along the upper surface of the substrate W toward the lowest peripheral portion of the inclined substrate W by gravity to be thereby removed from the peripheral portion of the substrate W. The IPA liquid film 111 is moved in the form of liquid mass (without disintegration into a multiplicity of liquid droplets) to be thereby smoothly and completely removed from above the substrate W.

Therefore, no IPA liquid droplets remain on the upper surface of the substrate W after the removal of the IPA liquid film 111. That is, even if the minute pattern 101 is provided on the upper surface of the substrate W, the liquid IPA does not remain in the gaps of the minute pattern 101. Therefore, even where the substrate W having the minute pattern 101 on the upper surface thereof is treated, it is possible to properly dry the upper surface of the substrate W while suppressing or preventing the collapse of the pattern.

In the organic solvent replacing step (S9), the substrate W is rotated at the puddling speed v1. As the rotation speed of the substrate W is thus reduced, the centrifugal force acting on the liquid IPA on the substrate W becomes zero or is reduced. Therefore, the liquid IPA is not expelled from the peripheral portion of the substrate W but is retained on the upper surface of the substrate W. As a result, the puddle-like IPA liquid film 111 is retained on the upper surface of the substrate W. The rinse liquid present on the upper surface of the substrate W is replaced with the IPA contained in the IPA liquid film 111 retained on the upper surface of the substrate W. Thus, the replacement of the rinse liquid with the IPA on the upper surface of the substrate W can be more advantageously achieved.

The first higher speed rotation step (S91) is performed prior to the puddling step (S92). In the first higher speed rotation step (S91), the substrate W is rotated at the first rotation speed, whereby the liquid IPA present on the substrate W receives the centrifugal force generated by the rotation of the substrate W to spread toward the peripheral portion of the substrate. Thus, the liquid IPA can be distributed over the entire upper surface of the substrate W. In the puddling step (S92) subsequent to the first higher speed rotation step (S91), therefore, the puddle-like IPA liquid film 111 covering the entire upper surface of the substrate W can be retained on the upper surface of the substrate W. Thus, the rinse liquid present on the upper surface of the substrate W can be properly replaced with the liquid IPA on the entire upper surface of the substrate W.

The substrate temperature increasing step (S10) is performed with the rotation of the substrate W stopped. If the substrate W is rotated in the substrate temperature increasing step (S8), the rotation speed of the peripheral portion of the substrate W would be higher and, therefore, the peripheral portion would be cooled. As a result, it would be impossible to increase the temperature of the peripheral portion of the upper surface of the substrate W to the liquid film levitation temperature TE1. In this case, it would be impossible to properly levitate the IPA liquid film 111 above the peripheral portion of the substrate W.

In the first exemplary process, in contrast, the rotation of the substrate W is stopped when the substrate temperature increasing step (S10) is performed, so that the temperature of the peripheral portion of the upper surface of the substrate W can be increased to the liquid film levitation temperature TE1. Thus, the IPA liquid film 111 can be levitated over the entire upper surface of the substrate W.

The hot plate 6 supports the substrate W from below in contact with the substrate W while heating the substrate W from below. The hot plate 6 is shifted from the horizontal attitude to the inclined attitude, whereby the upper surface of the substrate W is inclined with respect to the horizontal plane with the substrate W properly retained on the hot plate 6. This makes it possible to incline the upper surface of the substrate W with respect to the horizontal plane while heating the substrate W with the hot plate 6.

The peripheral portion of the hot plate 6 is supported from below by the plural extension units 24. The plural extension units 24 are controlled as having the same length, whereby the hot plate 6 is maintained in the horizontal attitude. Further, at least one of the extension units 24 is allowed to have a length different from those of the other extension units 24, whereby the hot plate 6 is maintained in the inclined attitude. With this simple arrangement, the hot plate 6 can be shifted between the horizontal attitude and the inclined attitude.

Figure 18:
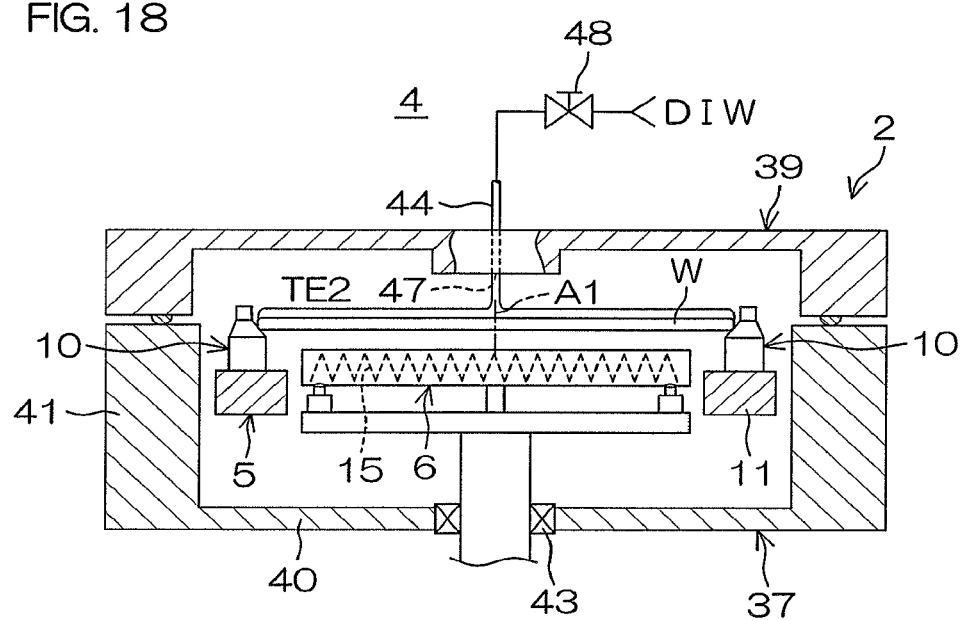
FIG. 18 is a schematic diagram for explaining a final rinsing step of a second exemplary process according to the present invention.

FIG. 18 is a schematic diagram for explaining a final rinsing step (S8) of a second exemplary process according to the present invention.

The second exemplary process to be performed by the substrate treatment apparatus 1 differs from the first exemplary process described above in that the upper surface of the substrate W is warmed by the hot plate 6 in the final rinsing step (S8) and the organic solvent replacing step (S9). The second exemplary process has the same process flow as the first exemplary process shown in FIG. 12.

In this case, the controller 3 controls the plate lift unit 16 to move up the hot plate 6 from the lower position (indicated in FIG. 13A and the like) to an intermediate position (indicated in FIG. 18, a height position at which at least the substrate opposing surface 6a of the hot plate 6 is located below the lower surface of the substrate W held by the substrate holding and rotating unit 5) prior to the final rinsing step (S8) or in the final rinsing step (S8). Therefore, the hot plate 6 is located at the intermediate position during the final rinsing step (S8) and the organic solvent replacing step (S9).

When the heater 15 is energized in the heat generating state with the hot plate 6 being located at the intermediate position, the heat from the substrate opposing surface 6a is applied to the substrate W held by the substrate holding and rotating unit 5 by the heat radiation. In this state, the hot plate 6 and the substrate W are spaced from each other, so that a smaller amount of heat is applied to the substrate W than when the substrate W is placed on the hot plate 6.

In the final rinsing step (S8) of the second exemplary process, the temperature of the upper surface of the substrate W is increased up to a predetermined preheating temperature (second temperature) TE2 by heating the substrate W with the hot plate 6. The preheating temperature TE2 is a temperature (e.g., about 40° C. to about 80° C.) predetermined so as to be lower than the boiling point of IPA (82.4° C.) and higher than an ordinary temperature.

After the temperature of the upper surface of the substrate W reaches the preheating temperature TE2, the temperature of the upper surface of the substrate W (the temperature of the upper surface of the minute pattern 101 (see FIG. 14C and the like), more specifically, the upper end surfaces 102A of the respective structures 102) is maintained at the preheating temperature TE2. At this time, the entire upper surface of the substrate W is maintained at the preheating temperature TE2. That is, the height of the intermediate position of the hot plate 6 is determined so that the upper surface of the substrate W can be maintained at the preheating temperature TE2.

In the final rinsing step (S8) and the organic solvent replacing step (S9) of the second exemplary process, the upper surface of the substrate W is warmed to the preheating temperature TE2. Therefore, the liquid IPA kept in contact with the upper surface of the substrate W has an increased diffusion coefficient. This improves the efficiency of the replacement with the IPA. As a result, the period of the organic solvent replacing step (S9) can be reduced.

Since the substrate temperature increasing step (S10) is started with the upper surface of the substrate W warmed, it is possible to reduce the time required for increasing the temperature of the upper surface of the substrate W up to the liquid film levitation temperature TE1. As a result, the period of the substrate temperature increasing step (S10) can be reduced.

After the end of the period of the organic solvent replacing step (S9), the controller 3 controls the plate lift unit 16 to move up the hot plate 6 from the intermediate position (indicated in FIG. 18) to the upper position (indicated in FIG. 13G and the like). Thus, the substrate W is disengaged from the substrate holding and rotating unit 5 to be transferred to the hot plate 6. Then, the substrate temperature increasing step (S10) is performed.

In the second exemplary process, the heating of the substrate W with the hot plate 6 is started in the final rinsing step (S8), but may be started in the organic solvent replacing step (S9).

Figure 19:
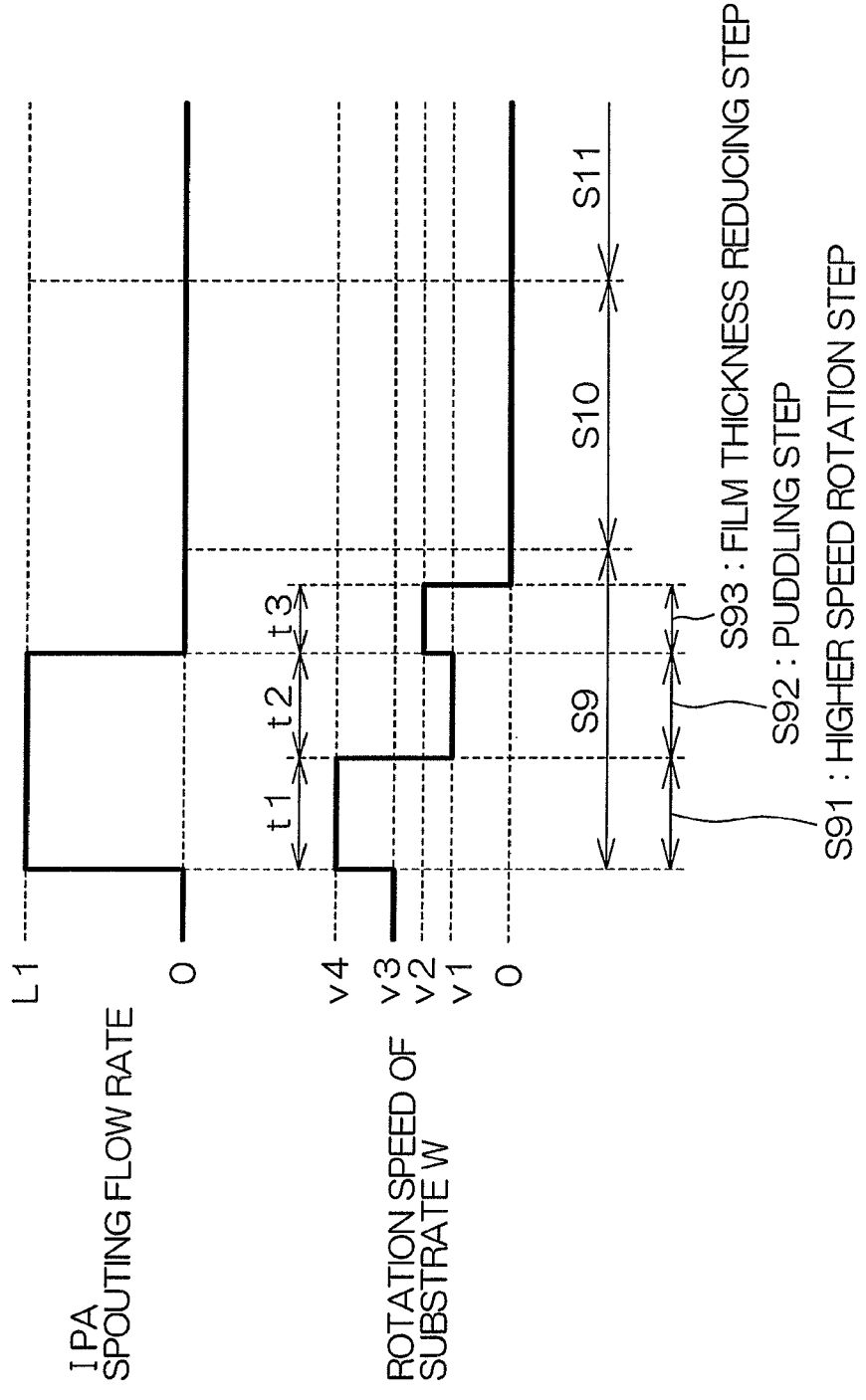
FIG. 19 is a diagram showing a change in IPA spouting flow rate and a change in substrate rotation speed in a third exemplary process according to the present invention.

FIG. 19 is a diagram showing a change in IPA spouting flow rate and a change in substrate rotation speed in a third exemplary process according to the present invention.

The third exemplary process to be performed by the substrate treatment apparatus 1 differs from the first exemplary process described above in that a film thickness reducing step (Step S93, see FIG. 19) is performed before the substrate temperature increasing step (S10) after the puddling step (S92) in the organic solvent replacing step (S9). In the film thickness reducing step (S93), the substrate W is rotated at a treatment rotation speed v2 (film thickness reducing rotation speed) that is higher than a rotation speed v1 of the substrate W observed in the puddling step (S92) and lower than the liquid treatment rotation speed v3. In synchronism with the start of the film thickness reducing step (S93), the spouting of the IPA is stopped.

After the completion of the puddling step (S92), more specifically, the controller 3 accelerates the rotation of the substrate W from the puddling speed v1 to the film thickness reducing rotation speed v2 (that is not lower than the puddling speed v1 and lower than the liquid treatment rotation speed v3, e.g., not lower than 50 rpm and lower than 100 rpm), and rotates the substrate W at the film thickness reducing rotation speed v2 for a predetermined film thickness reducing period t3 (e.g., for about 5 seconds). In synchronism with the start of the rotation in the film thickness reducing step (S93), the spouting of the IPA is stopped. By the lower speed rotation of the substrate W without the supply of the IPA, a centrifugal force generated by the rotation of the substrate W acts on the IPA liquid film 111 present on the substrate W to spread the IPA liquid film 111, thereby reducing the thickness of the IPA liquid film 111 (e.g., to 0.5 mm).

In the puddling step (S92), the centrifugal force acting on the liquid IPA present on the substrate W is zero or small and, therefore, the IPA liquid film 111 has a greater thickness (e.g., 1 mm). If the IPA liquid film 111 has a greater thickness when the substrate temperature increasing step (S10) is performed, the IPA liquid film 111 levitated above the substrate W also has a greater thickness, requiring a longer period for removing the IPA liquid film 111 in the liquid film removing step (S11).

In the third exemplary process, in contrast, the film thickness reducing step (S93) is performed prior to the substrate temperature increasing step (S10), so that the IPA liquid film 111 levitated above the substrate W has a smaller thickness (e.g., 0.5 mm) in the substrate temperature increasing step (S10). Thus, the period of the liquid film removing step (S11) (the time required for removing the IPA liquid film 111) can be reduced.

In the first to third exemplary processes, the final rinsing step (S8) is performed while sealing the inner space defined by the lower cup portion 37 and the lid member 39 by way of example. Alternatively, the final rinsing step (S8) may be performed while opening the inner space defined by the lower cup portion 37 and the lid member 39 (with the lid member 39 being located at the opening position). The rinse liquid from the rinse liquid outlet port 47 of the upper rinse liquid line 44 may be supplied to the upper surface of the substrate W, or the rinse liquid from the rinse liquid nozzle 28 may be supplied to the upper surface of the substrate W with the rinse liquid nozzle 28 being opposed to the upper surface of the substrate W. In this case, the inner space defined by the lower cup portion 37 and the lid member 39 is sealed after the final rinsing step (S8).

In the first to third exemplary processes, the first chemical liquid step (S2, S6) is repeated a plurality of times (twice) by way of example, but may be performed once.

In the first and second chemical liquid steps (S2, S4, S6) and the first to third rinsing steps (S3, S5, S7) of the first to third exemplary processes, both the upper and lower surfaces of the substrate W are treated by way of example, but only the upper surface (pattern formation surface) of the substrate W may be treated in these steps (S2 to S7).

In the first to third exemplary processes, the third rinsing step (S7) may be obviated.

While one embodiment of the present invention has thus been described, the present invention may be embodied in other ways.

Figure 20:
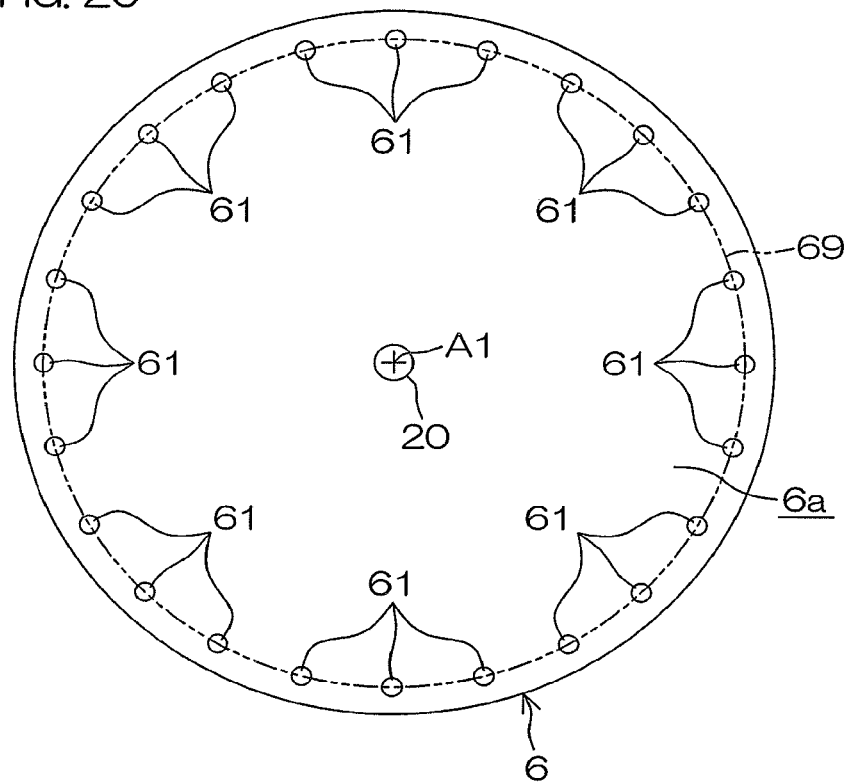
FIG. 20 is a diagram showing a first exemplary modification of the hot plate.

For example, as shown in FIG. 20, the multiple embosses 61 may be provided only on the peripheral portion of the substrate opposing surface 6a rather than on the entire substrate opposing surface 6a. In FIG. 20, a multiplicity of embosses 61 are equidistantly provided on a fourth phantom circle 69 defined about the rotation axis A1 on the peripheral portion of the substrate opposing surface 6a.

Figure 21:
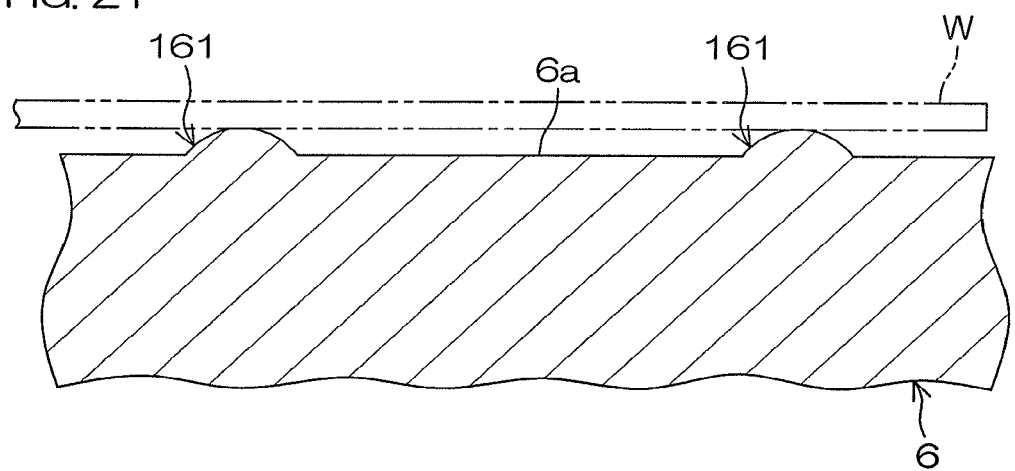
FIG. 21 is a diagram showing a second exemplary modification of the hot plate.

As shown in FIG. 21, embosses 161 provided integrally with the hot plate 6 may be employed instead of the embosses 61 defined by parts of the balls 66.

In the embodiment described above, the extension units 24 are disposed at the same circumferential positions as the corresponding fixed pins 10 with respect to the circumference of the hot plate 6 by way of example, but may be offset from the circumferential positions of the corresponding fixed pins 10 circumferentially of the hot plate 6. In this case, with the substrate W kept in the inclined attitude, the fixed pin 10 (fixed pin 210) closest to the shortest extension unit 224 may be brought into abutment against the lowest peripheral portion of the inclined substrate W, whereby the substrate W is prevented from slipping down from the hot plate 6.

In the first to third exemplary processes, the substrate W and the hot plate 6 are shifted together into the inclined attitude in order to move the IPA liquid film 111 laterally of the substrate W in the organic solvent removing step (S11). Alternatively, a guide member (a guide pin or a guide ring) having a guide surface may be provided in opposed relation to the peripheral portion of the substrate and, in the organic solvent removing step (S11), the guide member may be moved inward of the substrate W to bring the levitated IPA liquid film 111 into contact with the guide surface of the guide member. Since the magnitude of the frictional force occurring between the upper surface of the substrate W and the IPA liquid film 111 is generally zero, the levitated IPA liquid film 111 is guided along the guide surface laterally of the substrate W in the form of liquid mass (without disintegration into a multiplicity of liquid droplets) by the contact between the guide surface of the guide member and the IPA liquid film 111. Thus, the IPA liquid film 111 can be completely removed from above the substrate W. Where this arrangement is employed, both the substrate W and the hot plate 6 can be maintained in the horizontal attitude in the organic solvent removing step (S11). In this case, the hot plate attitude shifting unit 90 may be obviated from the substrate treatment apparatus 1.

In the organic solvent removing step (S11), the removal of the organic solvent may be achieved by opening the nitrogen gas valve 52 to spout the nitrogen gas from the nitrogen gas outlet port 51 and spraying the nitrogen gas to the center portion of the upper surface of the substrate W rather than by shifting the substrate W and the hot plate 6 into the inclined attitude. Thus, a smaller-diameter dry region is formed in a center portion of the levitated IPA liquid film 111. The magnitude of the frictional force occurring between the upper surface of the substrate W and the IPA liquid film 111 is generally zero. Therefore, the dry region is expanded, as the nitrogen gas is continuously spouted from the nitrogen gas outlet port 51. The dry region spreads over the entire upper surface of the substrate W, whereby the levitated IPA liquid film 111 is guided laterally of the substrate W in the form of liquid mass (without disintegration into a multiplicity of liquid droplets). Thus, the IPA liquid film 111 can be completely removed from above the substrate W.

In the organic solvent removing step (S11), the guide member may be moved inward of the substrate W and, at the same time, the nitrogen gas may be sprayed to the center portion of the upper surface of the substrate W.

In the embodiment described above, the hot plate 6 is moved up and down to transfer the substrate W between the hot plate 6 and the substrate holding and rotating unit 5 by way of example, but the hot plate 6 and the substrate W may be transferred by moving up and down the substrate holding and rotating unit 5 or by moving up and down both the hot plate 6 and the substrate holding and rotating unit 5.

A slippage preventing member may be provided separately from the fixed pin 210. In this case, the slippage preventing member is brought into engagement with the lowest peripheral portion of the inclined substrate W for prevention of the slippage of the substrate W from the hot plate 6.

Where the inclination angle is sufficiently small or the magnitude of the frictional force occurring between the embosses 61 and the lower surface of the substrate W is sufficiently great when the substrate W and the hot plate 6 are kept in the inclined attitude, the substrate W is not moved along the substrate opposing surface 6a. In this case, therefore, there is no need to provide the fixed pin 210 or other slippage preventing member for the prevention of the slippage of the substrate W. Where components each having a higher contact frictional force are provided at distal ends of the embosses 61 (161), for example, the slippage of the inclined substrate W can be prevented only by the embosses 61 (161) without supporting the peripheral portion of the substrate W by the fixed pin 210 or the like.

In the embodiment described above, the substrate W is placed on the hot plate 6 and, in this state, heated in the substrate temperature increasing step (S10) by way of example. Alternatively, the hot plate 6 may be located adjacent to the lower surface of the substrate W held by the substrate holding and rotating unit 5 to heat the substrate W in the substrate temperature increasing step (S10). In this case, the amount of the heat to be applied to the substrate W can be controlled by changing the distance between the hot plate 6 and the substrate W.

In the embodiment described above, the heating temperature of the substrate W is controlled by moving up and down the hot plate 6 with the use of the plate lift unit 16. Where the amount of the heat to be generated by the hot plate 6 can be controlled at two stages (an ON-state and an OFF-state), the heating temperature of the substrate W may be controlled without the use of the plate lift unit 16.

In this case, it is possible to rotate the substrate W in the substrate temperature increasing step (S10). In the substrate temperature increasing step (S10), the substrate W may be rotated during a certain period or the entire period of the substrate temperature increasing step (S10). In this case, however, the rotation speed of the substrate W is desirably a lower speed (e.g., about 10 rpm to about 100 rpm) such that the peripheral portion of the upper surface of the substrate W is prevented from being cooled. Where the rotation speed of the substrate W is lower, only a small centrifugal force acts on the IPA liquid film 111 in the substrate temperature increasing step (S10), thereby more reliably preventing the IPA liquid film 111 from being slit as indicated by 113.

In the embodiment described above, hydrofluoric acid and APM are used as the first and second chemical liquids, respectively, by way of example, but a liquid containing at least one of sulfuric acid, acetic acid, nitric acid, hydrochloric acid, hydrofluoric acid, ammonia water, hydrogen peroxide water, organic acids (e.g., citric acid, oxalic acid and the like), organic alkalis (e.g., TMAH: tetramethylammonium hydroxide and the like), a surfactant and an anticorrosion agent may be used as the first or second chemical liquid in the cleaning treatment and the etching treatment.

The substrate W may be treated with only one chemical liquid rather than with the plural types of chemical liquids (two chemical liquids).

IPA is used as the organic solvent having a lower surface tension than the rinse liquid by way of example. Other examples of the organic solvent include methanol, ethanol, acetone and HFE (hydrofluoroether).

In the embodiment described above, the chemical liquid treatment (etching treatment, cleaning treatment or the like) is performed at an atmospheric pressure, but the pressure of the treatment environment is not limited to the atmospheric pressure. For example, the atmosphere of the sealed space defined by the lid member 39 and the lower cup portion 37 may be controlled at an increased or reduced pressure by means of a predetermine pressure controlling unit. Thus, the etching treatment, the cleaning treatment or the like according to the embodiment described above may be performed in a higher pressure environment or a lower pressure environment which is controlled at a pressure higher or lower than the atmospheric pressure.

In the embodiments described above, the substrate W is heated with the substrate opposing surface 6*a* of the hot plate 6 kept in contact with the back surface of the substrate W. The substrate W may be heated by locating the substrate W adjacent to the substrate opposing surface 6*a* rather than by bringing the substrate W into contact with the substrate opposing surface 6*a* according to the present invention.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A substrate treatment apparatus for drying a substrate supplied with a rinse liquid, the apparatus comprising:
a substrate holding and rotating unit that holds the substrate supplied with the rinse liquid in a horizontal posture at a substrate holding position where a lower surface of the substrate is to be positioned, and that rotates the substrate around a vertical rotation axis passing through a center portion of the substrate held by the substrate holding and rotating unit;
a hot plate, having a substrate opposing surface and embosses projecting upward from the substrate opposing surface and distributed on the substrate opposing surface, that heats the substrate from below, the hot plate being movable, without interfering with the substrate holding and rotating unit, between a lower position at which the embosses are spaced downward from the substrate holding position and an upper position at which the embosses project above the substrate holding position;
an organic solvent supplying unit which supplies an organic solvent having a lower surface tension than the rinse liquid to an upper surface of the substrate held by the substrate holding and rotating unit;
a cup that accommodates the substrate holding and rotating unit and the hot plate;
a plate lift unit that moves the hot plate up and down, between the lower position and the upper position; and
an inert gas outlet port that sprays an inert gas on a center of the upper surface of the substrate supported by the hot plate placed at the upper position; wherein
the organic solvent supplying unit supplies the organic solvent to the upper surface of the substrate which is rotated and held by the substrate holding and rotating unit, whereby the rinse liquid on the substrate is replaced with the organic solvent to form an organic solvent liquid film on the upper surface of the substrate,
the plate lift unit raises the hot plate to the upper position, whereby the substrate holding the organic solvent liquid film on the upper surface thereof is transferred from the substrate holding and rotating unit to the hot plate,
the hot plate, when placed at the upper position, heats the substrate while supporting the substrate in a stationary state and in contact with the lower surface of the substrate, whereby a vapor film of the organic solvent is formed below the entire organic solvent liquid film between the organic solvent liquid film and the upper surface of the substrate and the organic solvent liquid film is levitated above the organic solvent vapor film without causing a slitting in the organic solvent liquid film,
the inert gas outlet port sprays the inert gas to the levitated organic solvent liquid film, whereby the levitated organic solvent liquid film is guided to a side of the substrate and removed from the upper surface of the substrate, while the levitated organic solvent liquid film maintaining a liquid mass without disintegration.

2. The substrate treatment apparatus according to claim 1, wherein
the plate lift unit is operable to stop the hot plate at an intermediate position between the lower position and the upper position,
the organic solvent supply unit replaces the rinse liquid with the organic solvent in the state where the hot plate is positioned at the intermediate position.

3. The substrate treatment apparatus according to claim 1, wherein
the substrate holding and rotating unit includes
an annular support ring having a greater outer diameter than the substrate, having an inner diameter greater than a diameter of the hot plate, and having a rotation center concentric with the rotation axis of the substrate,
a plurality of fixed pins provided on an upper surface of the support ring and immovable with respect to the support ring, and a plurality of movable pins provided on the upper surface of the support ring and movable with respect to the support ring, the hot plate and the support ring of the substrate holding and rotating unit do not overlap with each other when viewed vertically.

4. The substrate treatment apparatus according to claim 1, wherein the plate lift unit includes a ball screw and a motor.

5. The substrate treatment apparatus according to claim 1, wherein the hot plate, when placed at the upper position, heats the substrate at a temperature that is higher than a boiling point of the organic solvent and that prevents the organic solvent liquid film formed on the upper surface of the substrate from boiling.

6. A substrate treatment apparatus for drying a substrate supplied with a rinse liquid, the apparatus comprising:
   a substrate holding and rotating unit that holds the substrate supplied with the rinse liquid in a horizontal posture at a substrate holding position where a lower surface of the substrate is to be positioned, and that rotates the substrate around a vertical rotation axis passing through a center portion of the substrate held by the substrate holding and rotating unit;
   a hot plate, having a substrate opposing surface and embosses projecting upward from the substrate opposing surface and distributed on the substrate opposing surface, that heats the substrate from below, the hot plate being movable, without interfering with substrate holding and rotating unit, between a lower position at which the embosses are spaced downward from the substrate holding position and an upper position at which the embosses project above the substrate holding position;
   an organic solvent supplying unit which supplies an organic solvent having a lower surface tension than the rinse liquid to an upper surface of the substrate held by the substrate holding and rotating unit;
   a cup that accommodates the substrate holding and rotating unit and the hot plate;
   a plate lift unit that moves the hot plate up and down, between the lower position and the upper position; and
   an inert gas outlet port that sprays an inert gas on a center of the upper surface of the substrate supported by the hot plate placed at the upper position; wherein
   the substrate holding and rotating unit includes
   an annular support ring having a greater outer diameter than the substrate, having an inner diameter greater than a diameter of the hot plate, and having a rotation center concentric with the rotation axis of the substrate,
   a plurality of fixed pins provided on an upper surface of the support ring and immovable with respect to the support ring, and
   a plurality of movable pins provided on the upper surface of the support ring and movable with respect to the support ring,
   the hot plate and the support ring of the substrate holding and rotating unit do not overlap with each other when viewed vertically.

* * * * *